United States Patent
Chou

(10) Patent No.: US 7,352,266 B2
(45) Date of Patent: Apr. 1, 2008

(54) HEAD ELECTRODE REGION FOR A RELIABLE METAL-TO-METAL CONTACT MICRO-RELAY MEMS SWITCH

(75) Inventor: Chia-Shing Chou, Oak Park, CA (US)

(73) Assignee: Wireless MEMS, Inc., Oak Park, CA (US)

( * ) Notice: Subject to any disclaimer, the term of this patent is extended or adjusted under 35 U.S.C. 154(b) by 146 days.

(21) Appl. No.: 10/994,704

(22) Filed: Nov. 20, 2004

(65) Prior Publication Data
US 2005/0183938 A1    Aug. 25, 2005

(51) Int. Cl.
H01H 51/22    (2006.01)
(52) U.S. Cl. .................................... 335/78; 200/181
(58) Field of Classification Search ............... 335/78; 200/181
See application file for complete search history.

(56) References Cited

U.S. PATENT DOCUMENTS

| | | | |
|---|---|---|---|
| 5,121,089 | A | 6/1992 | Larson |
| 5,258,591 | A | 11/1993 | Buck |
| 5,578,976 | A | 11/1996 | Yao |
| 5,629,565 | A | 5/1997 | Schlaak et al. |
| 5,638,946 | A | 6/1997 | Zavracky |
| 6,046,659 | A | 4/2000 | Loo et al. |
| 6,310,339 | B1 * | 10/2001 | Hsu et al. ............... 250/214.1 |
| 6,331,257 | B1 | 12/2001 | Loo et al. |
| 6,667,245 | B2 | 12/2003 | Chow et al. |
| 6,803,559 | B2 | 10/2004 | Hsu et al. |
| 6,842,097 | B2 | 1/2005 | Hsu et al. |

OTHER PUBLICATIONS

Petersen, K.E. 1978, "Dynamic micromechanics on silison: techniques and devices."

Petersen, K.E, "Forming the Contact Surface of Micromechanical Switches", IBM J. Res. Develop., vol. 23, No. 4, Jul. 1979, pp. 376-385.

Daniel Hyman, Juan Lam, Brett Warneke, Adele Schmitz, T. Y. Hsu, Julia Brown, James Schaffner, Andy Walston, Robert Y. Loo, Mehran Mehregany, and Jae Lee, "Surface-micromachined RF MEMS switches on GaAs substrates," International Journal of RF and Microwave CAE, vol. 9, No. 4, Jul. 1999, pp. 348-361.

Y. Wang, Z. Li, D. T. McCormick, and N. C. Tien, "A Low-voltage Lateral MEMS Switch with High RF Performance," Journal of MicroElectroMechanical Systems (JMEMS), vol. 13, No. 6, Dec. 2004, pp. 902-911.

Yao, J.J., "RF MEMS from a device perspective", Journal Micromechanics and Microengineering 10: R9-R38, 2000.

Zavracky, P.M., Majumdar, S., McGruer,N, 1997, "Micromechanical switches fabricated using nickel surface micromachining", Journal of Microelectromechannical Systems 6(1): 3-9.

* cited by examiner

Primary Examiner—Anh Mai
Assistant Examiner—Bernard Rojas
(74) Attorney, Agent, or Firm—Tope-McKay & Associates

(57) ABSTRACT

A head electrode region for an electromechanical device is presented, comprising a first insulating layer having electrode region edges; and a head electrode, where the head electrode comprises a locking portion, with the locking portion surrounding the electrode region edges of the first insulating layer such that the head electrode is held fixed relative to the first insulating layer. The head electrode region can further comprise a top region residing above the first insulating layer and a contact region residing below the first insulator, the head electrode region further comprising a second insulating layer formed to cover at least a portion of the top region of the head electrode.

2 Claims, 20 Drawing Sheets

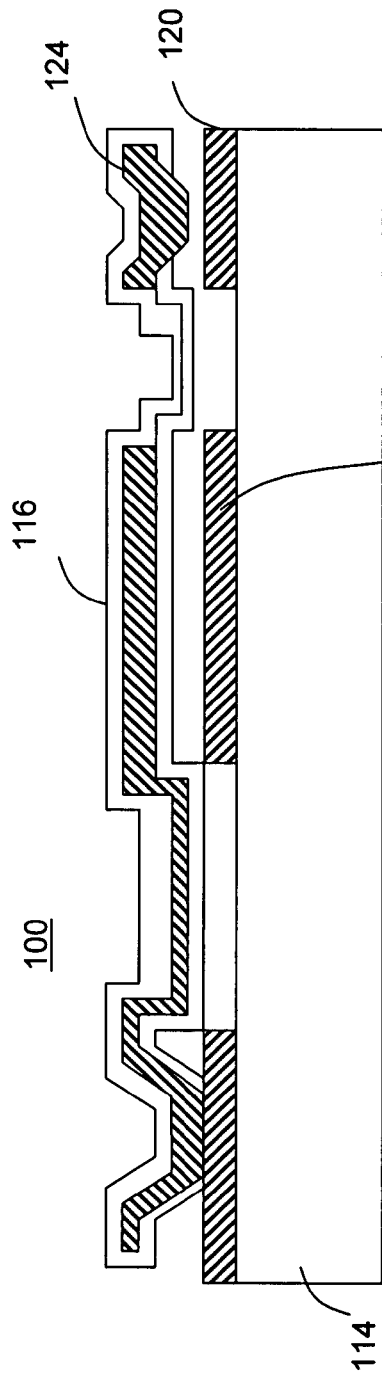
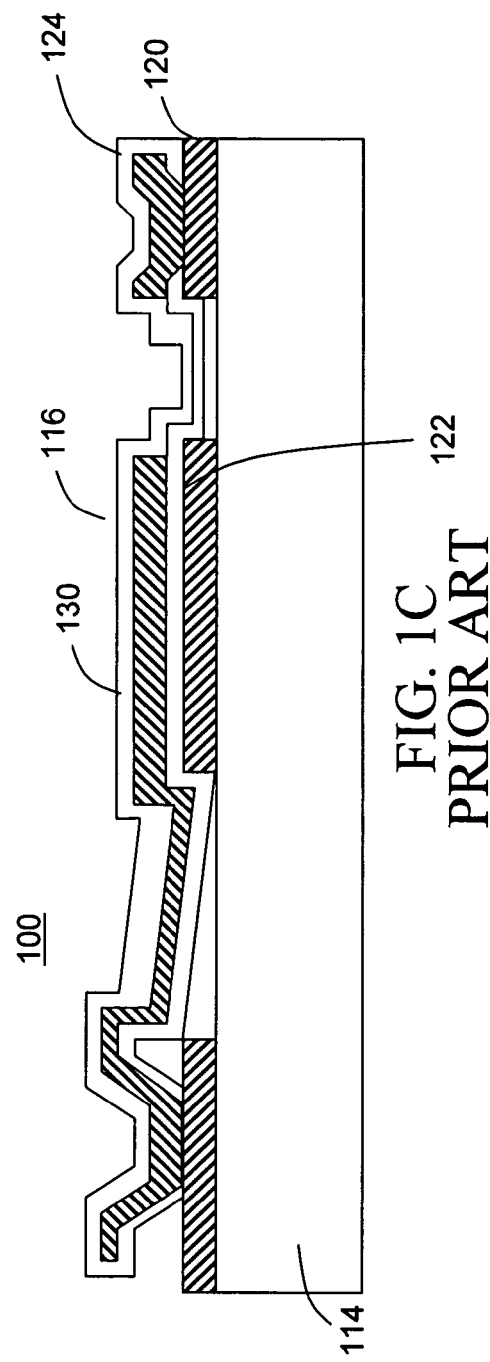
FIG. 1B
PRIOR ART
FIG. 1C
PRIOR ART

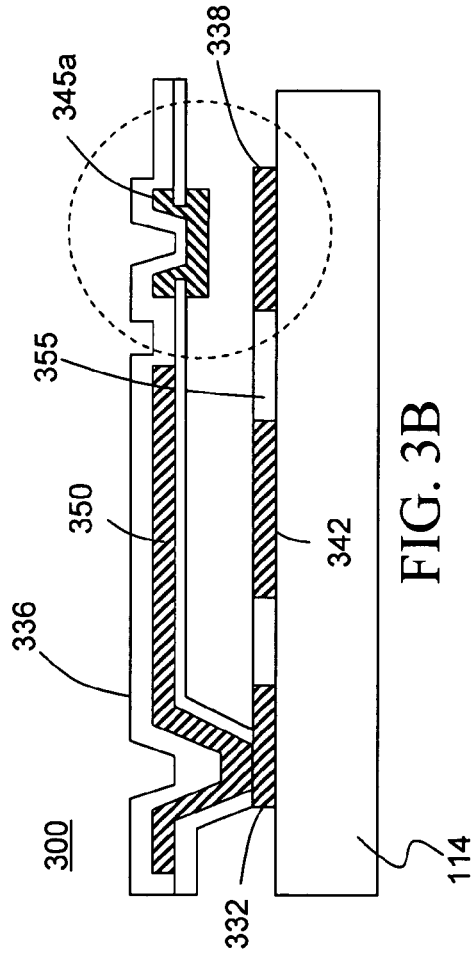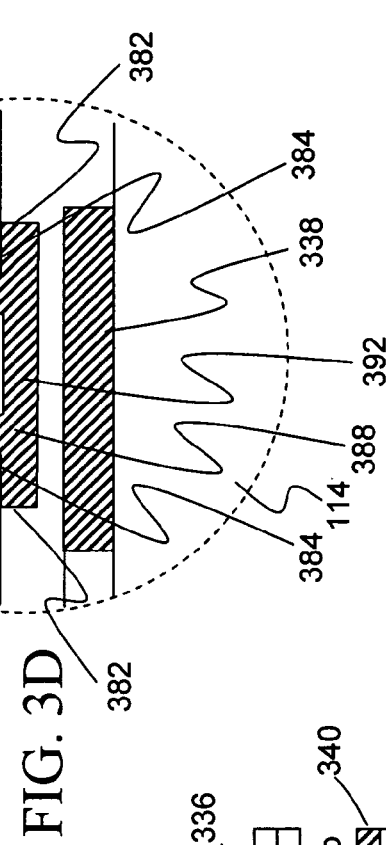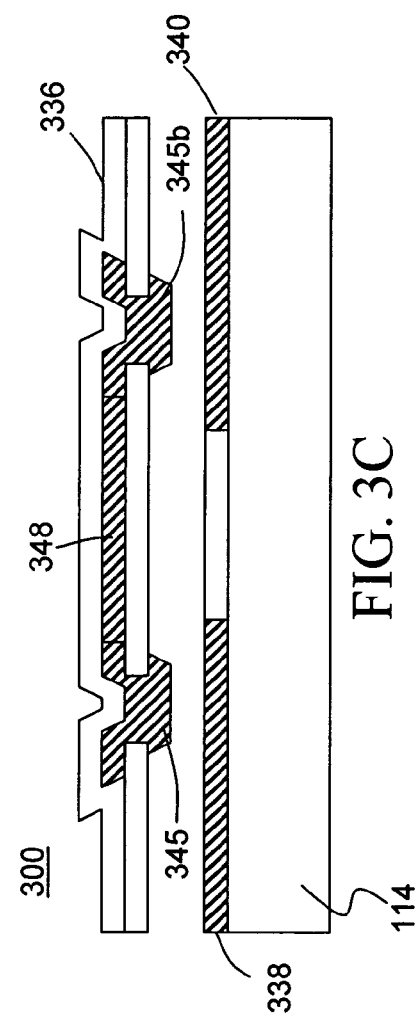
FIG. 3B
FIG. 3C
FIG. 3D

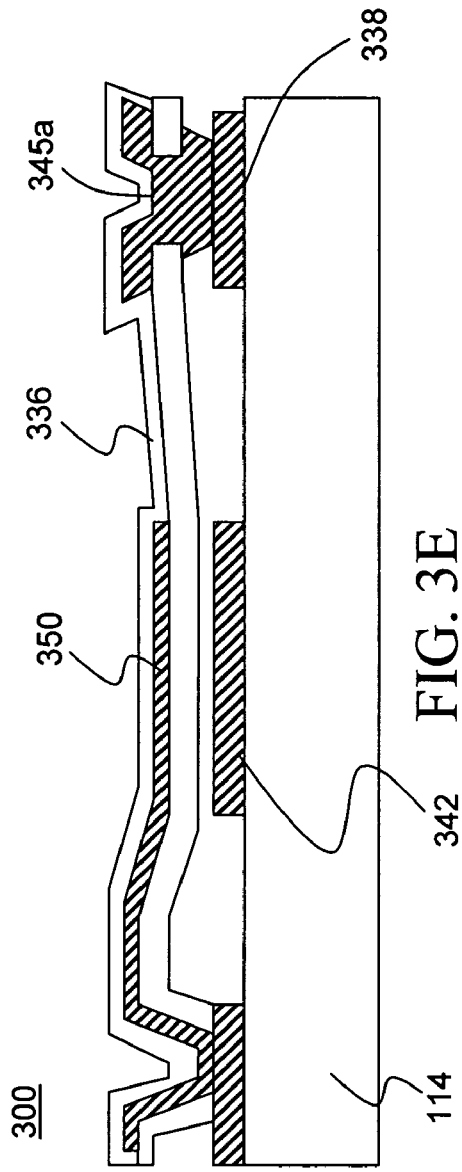
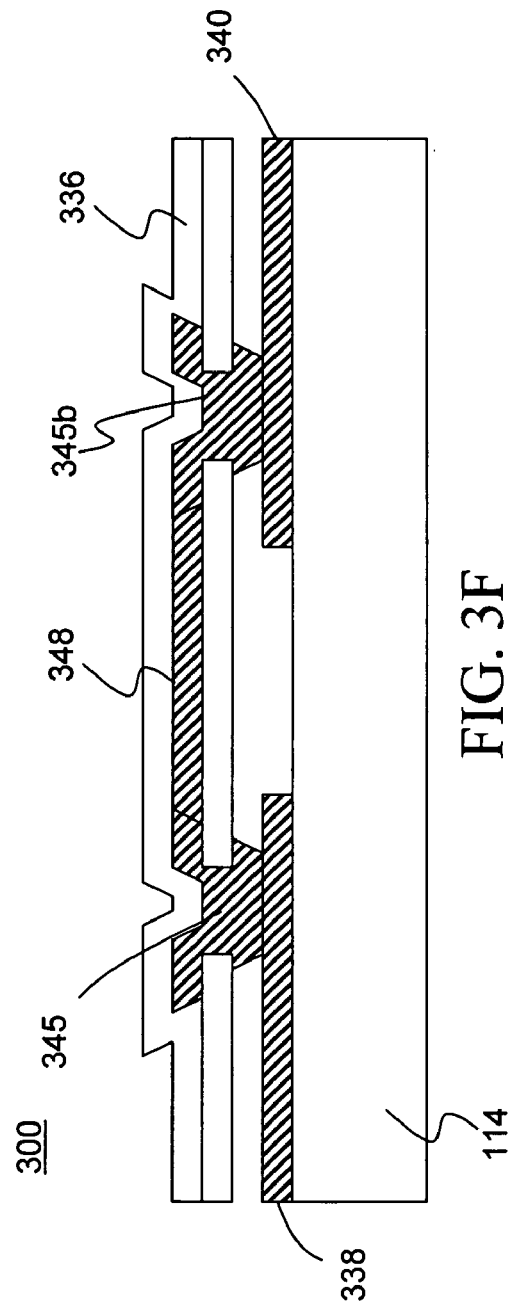

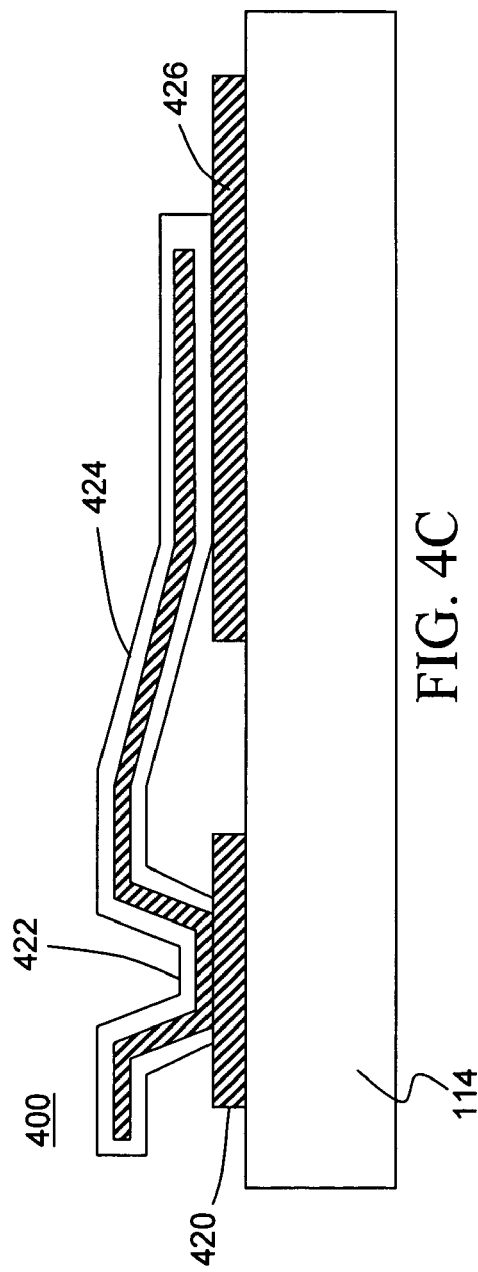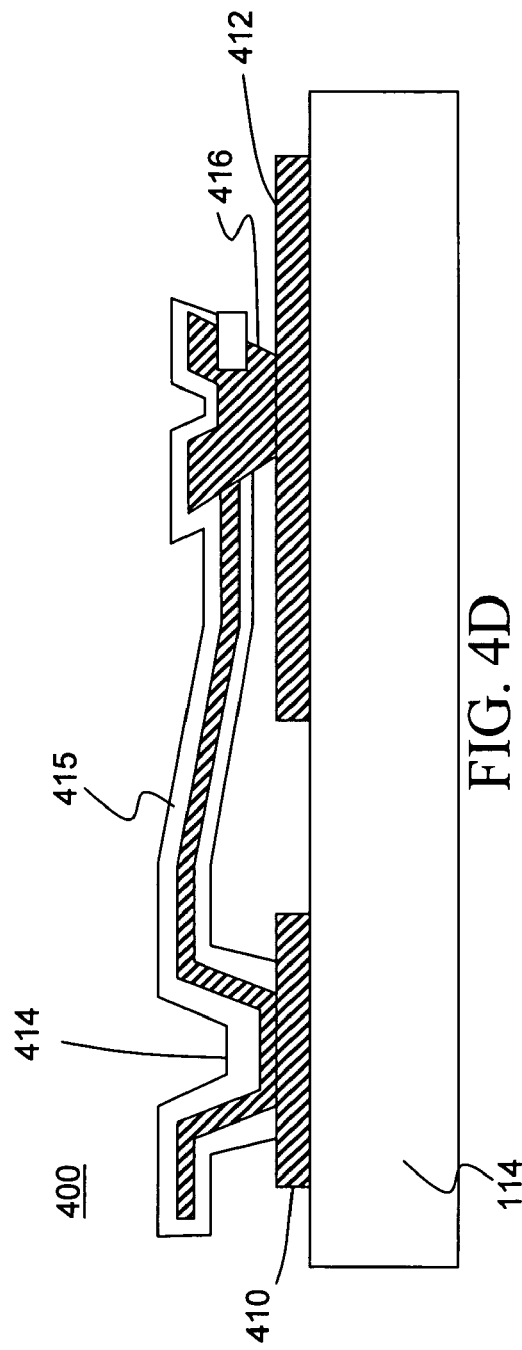

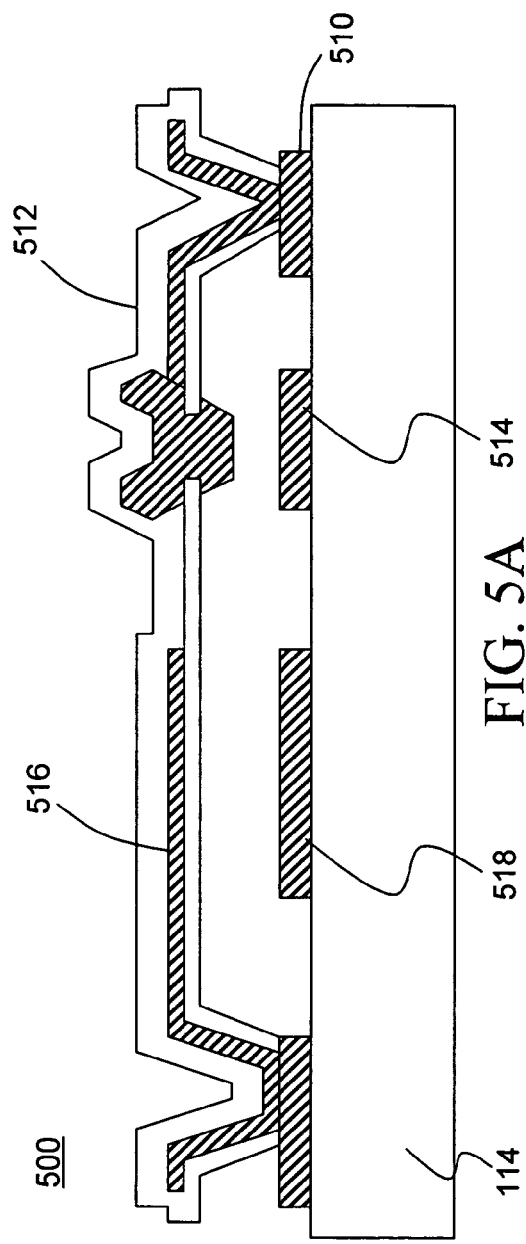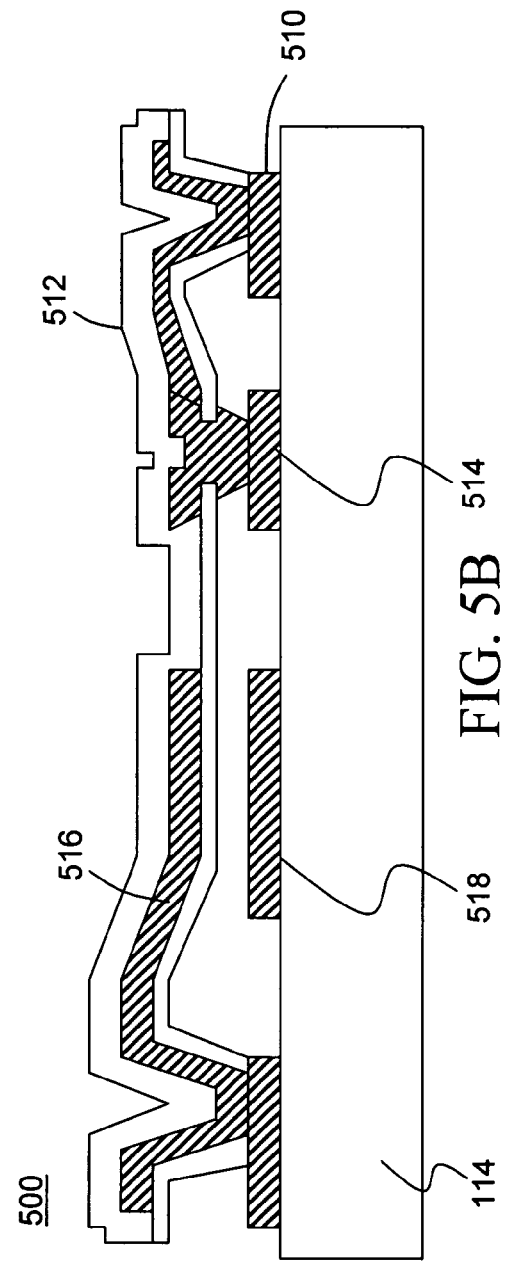

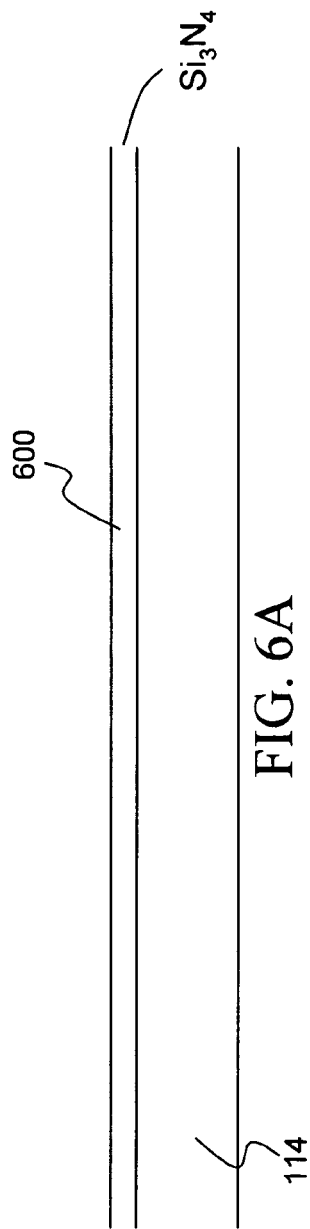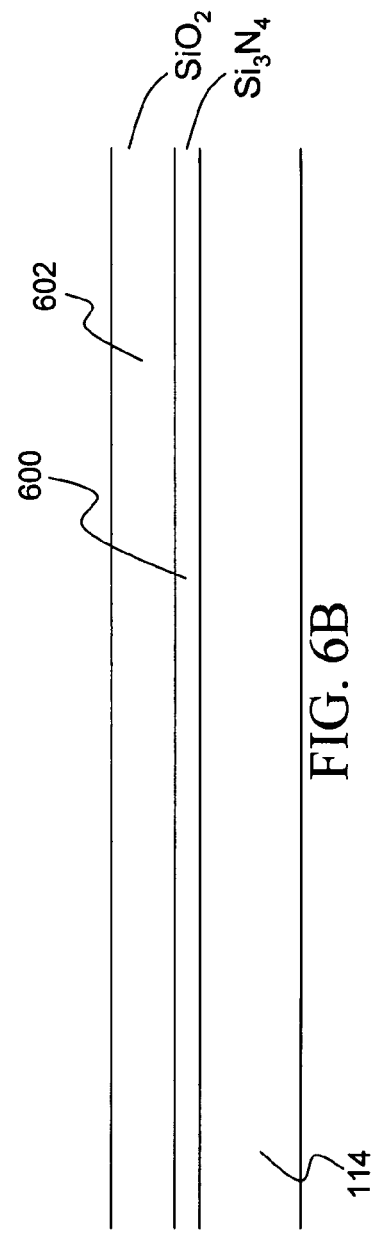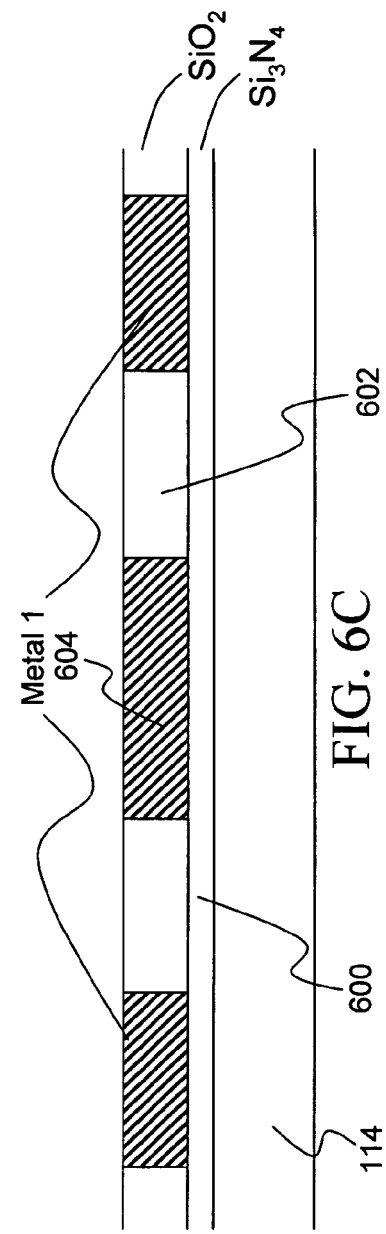

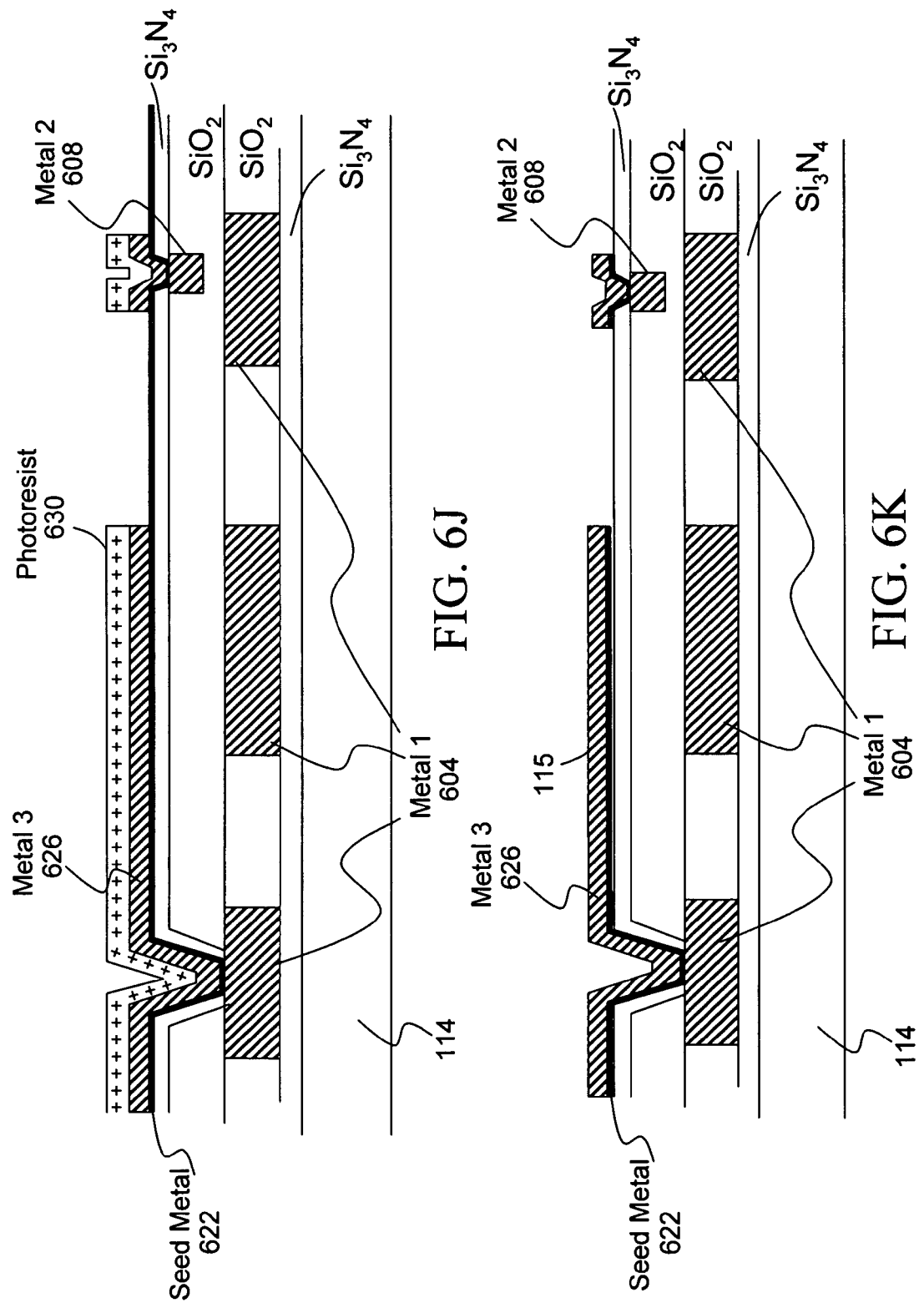

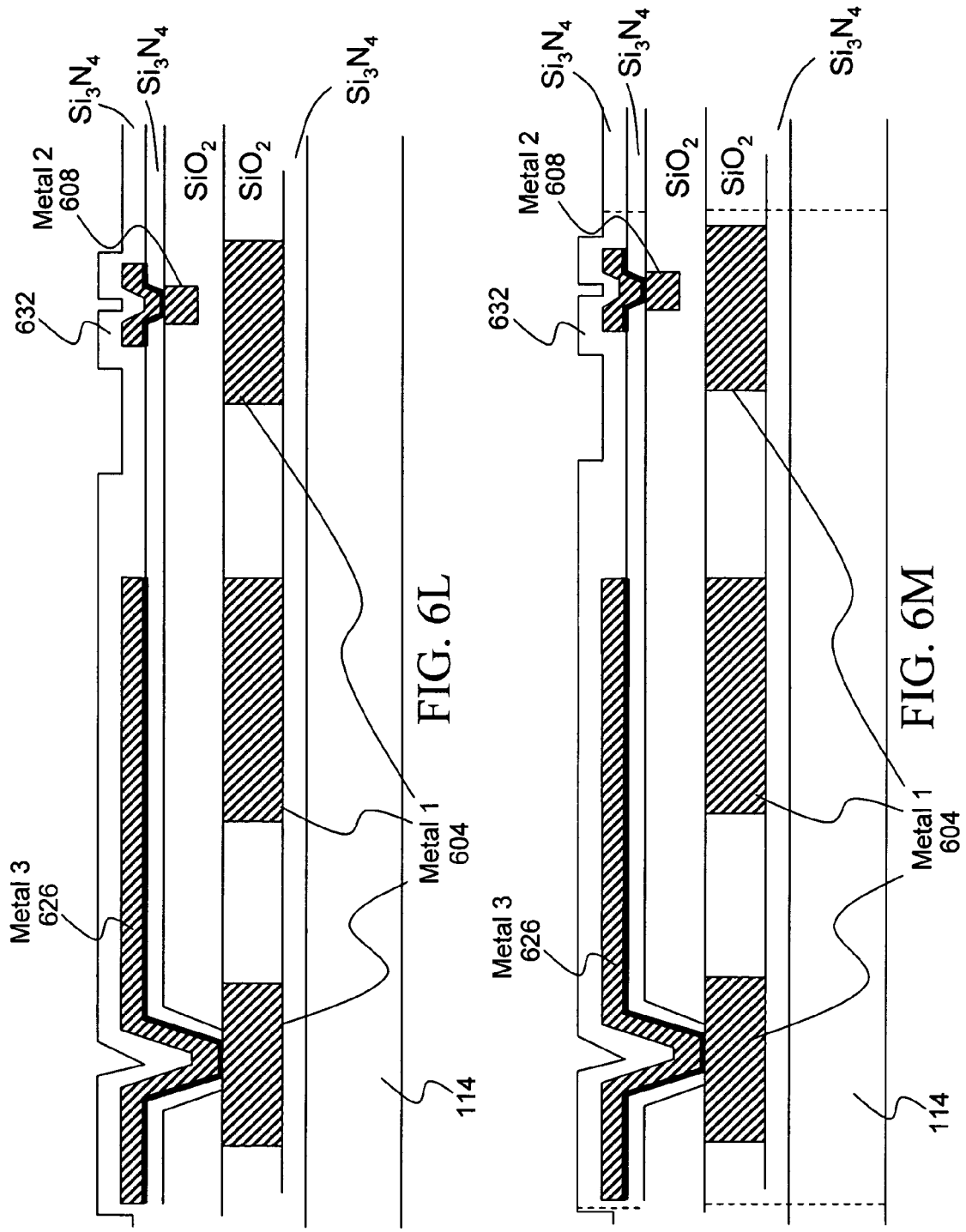

| Layer | Materials | Deposit Process | Removal Process | Etch Process | Thickness |
|---|---|---|---|---|---|
| Substrate | Semiconducting Insulators, e.g., Silicon, GaAs, Quartz, Sapphire | N/A | N/A | N/A | 300 μm - 600 μm |
| Dielectric Layer | Nitride, Oxide, Phosphorous Doped Oxide | PECVD, LPCVD | N/A | Wet Etch/Dry Etch | .1 μm - 5 μm |
| Photoresist | Positive Photoresist/Negative Photoresist | Spin Coat | Resist Stripper/Plasma Stripping | Spray Develop/Tank Develop | 1 μm-8 μm |
| Substrate Electrodes | Goal/Any Conductor | E-beam Evaporation, Thermal Evaporation, Sputtering | N/A | Lift-off, Pattern and Etch | .5 μm-5 μm |
| Sacrificial Layer | Oxide, Silicon Metal (i.e., Al) | PECVD, LPCVD, E-Beam Evaporation | Wet Etch/Dry Etch | N/A | .5 μm-5 μm |
| 1st Insulating Layer | Nitride/Oxide | PECVD | N/A | Dry Etch | .5 μm-5 μm |
| Top Electrode Layer(s) | Gold/Any Conductor | E-Beam Evaporation, Thermal Evaporation, Plating | N/A | Wet Etch | .5 μm-5 μm |
| 2nd Insulating Structure Layer | Nitride, Oxide | PECVD | N/A | Dry Etch, Ion Milling | .5 μm-5 μm |

FIG. 7

HEAD ELECTRODE REGION FOR A RELIABLE METAL-TO-METAL CONTACT MICRO-RELAY MEMS SWITCH

BACKGROUND OF THE INVENTION

(1) Technical Field

The present invention relates to a fabrication technique for a micro-electro-mechanical system (MEMS) micro relay switch to increase the reliability, yield, and performance of its contacts. Specifically, the invention relates to a planarization process for the cantilever beam, surface passivation of the substrate, and a unique design of the metal dimple for making a reproducible and reliable contact.

(2) Discussion

Today, there are two types of MEMS switches for RF and microwave applications. One type is the capacitance membrane switch known as the shunt switch, and the other is the metal contact switch known as the series switch. Besides the two types of switches mentioned above, designs can vary depending on the methods with which the switches are actuated. Generally, switch designs are based on either electrostatic, thermal, piezoelectric, or magnetic actuation methods.

The metal contact series switch is a true mechanical switch in the sense that it toggles up (open) and down (close). One difference among the metal contact switch designs is in their armature structure. For example, switches from Sandia National Labs and Teravita Technologies use an all metal armature. MEMS switches from Rockwell use an armature composed of a metal layer on top of an insulator and switches from HRL Laboratories, LLC use an insulating armature having a metal electrode that is sandwiched between two insulating layers. Because of the difference in armature designs, metal contacts in these devices are all fabricated differently; however, in each of these designs the metal contacts are all integrated with part of the armature. The performance of these switches is mainly determined by the metal contact and the armature design. One important issue, occurring when the metal contact is part of the armature, relates to the fabrication process, wherein performance may be sacrificed if the contact is not well controlled.

U.S. Pat. No. 6,046,659 issued Apr. 4, 2000 to Loo et al. (herein after referred to as the "Loo Patent") discloses two types of micro-electro-mechanical system (MEMS) switches, an I-switch and a T-switch. In the "Loo Patent", both the I and T-MEMS switches utilize an armature design, where one end of an armature is affixed to an anchor electrode and the other end of the armature rests above a contact electrode.

FIG. 1A depicts a top view of a T-switch 100 as disclosed in the prior art. A cross-section of the switch shown in FIG. 1A is shown in FIGS. 1B and IC. In FIG. 1B the switch is in an open position, while in FIG. 1C, the switch is in a closed position. In this aspect, a radio-frequency (RF) input transmission line 118 and a RF-output transmission line 120 are disposed on the substrate 114, shown in FIG. 1B. A conducting transmission line 128 is disposed across one end of an armature 116, allowing for connection between the RF-input transmission line 118 and the RF-output transmission line 120 when the switch is in the closed position. One skilled in the art will appreciate that the cross-section only shows the contact of the armature 116 with the RF-output transmission line 120, since the contact of the armature 116 with the RF-input transmission line 118 is directly behind the RF-output transmission line 120 when looking at the cross-section of the switch. Thus, for ease of explanation, FIGS. 1B and 1C will be discussed emphasizing the RF-output transmission line 120; however, the same explanation also holds for contacting of the RF-input transmission line 118. Further, one skilled in the art will appreciate that the RF-input and RF-output transmission lines are labeled as such for convenience purposes only and are interchangeable.

When the switch is in an open position, the transmission line 128 sits above (a small distance from) the RF-input transmission line 118 and the RF-output transmission line 120. Thus, the transmission line 128 is electrically isolated from both the RF-input transmission line 118 and the RF-output transmission line 120. Furthermore, because the RF-input transmission line 118 is not connected with the RF-output transmission line 120, the RF signals are blocked and they cannot conduct from the RF-input transmission line 118 to the RF-output transmission line 120.

When the switch is in closed position, the conducting transmission line 128 is in electrical contact with both the RF-output transmission line 120, and the RF-input transmission line 118. Consequently, the three transmission lines 120, 128, and 118 are connected in series to form a single transmission line in order to conduct RF signals. The "Loo Patent" also provides switches that have conducting dimples 124 and 124' attached with the transmission line 128 which define metal contact areas to improve contact characteristics.

FIG. 1B is a side view of a prior art micro-electro-mechanical system (MEMS) switch 100 of FIG. 1A in an open position. A conducting dimple 124 protrudes from the armature 116 toward the RF-output transmission line 120. The transmission line 128 (shown in FIG. 1A) is deposited on the armature 116 and electrically connects the dimple 124 associated with the RF-output transmission line 120 to another dimple 124' associated with the RF-input transmission line 118.

FIG. 1C depicts the MEMS switch 100 of FIG. 1A in a closed state. When a voltage is applied between a suspended armature bias electrode 130 and a substrate bias electrode 122, an electrostatic attractive force will pull the suspended armature bias electrode 130 as well as the attached armature 116 toward the substrate bias electrode 122, and the (metal) contact dimple 124 will touch the RF-output transmission line 120. The contact dimple 124 associated with the RF-input transmission line 118 will also come into contact with the RF-input transmission line 118, thus through the transmission line 128 (shown in FIG. 1A) the RF-input transmission line 118 is electrically connected with the RF-output transmission line 120 when the switch is in a closed position. Note that in the FIG. 1A, the armature 116 is anchored to the substrate 114 by an anchor 132 and that bias input signal pads 134 and 136 are provided for supplying power necessary for closing the switch 100.

FIG. 2A depicts a top view of an I-switch 200 as disclosed in the prior art. FIG. 2B depicts a direct current (DC) cross-section of the switch 200 while, FIG. 2C depicts a RF cross-section of the switch 200. In FIG. 2B, a DC signal is passed from the DC contact 220 through an anchor point 222 and into a DC cantilever structure 224. A substrate bias electrode 226 is positioned on the substrate 114. As a DC bias is applied to the DC contact 220 and the substrate bias electrode 226, the DC cantilever structure 224 is pulled toward the substrate 114, causing the RF cantilever structure 215 (shown in FIG. 2C), shown in FIG. 2A, to also be deflected toward the substrate 114. FIGS. 2D and 2E depict the switch 200 in the closed position from the same perspectives as shown in FIGS. 2B and 2C, respectively.

FIG. 2C depicts the RF cross-section of switch 200. The RF-input transmission line 210 passes through anchor point 214 and into the RF cantilever structure 215. The metal dimple 216 protrudes from the RF cantilever structure 215. For ease of explanation the RF cantilever structure 215 and the DC cantilever structure 224 are described herein as two separate structures; however, one skilled in the art will appreciate that these two structures are typically made of one piece of material. The metal dimple 216 provides an electrical contact between the RF-input transmission line 210 and the RF-output transmission line 212. As discussed above, when a DC bias is applied to the DC contact 210 and the substrate bias electrode 226 (shown in FIG. 2B), the RF cantilever structure 215 is deflected toward the substrate 114. The deflection of the RF cantilever structure 215 toward the substrate 114 provides an electrical path between the RF-input transmission line 210 and the RF-output transmission line 212. FIGS. 2D and 2E depict the switch 200 in the closed position from the same perspectives as shown in FIGS. 2B and 2C, respectively. Note that in FIG. 2A the path shown in FIGS. 2B and 2D is depicted between 200$b$ and 200$b'$ in and that the path shown in FIGS. 2C and 2E is depicted between 200$c$ and 200$c'$.

The process of forming the dimple on the armature requires carefully controlled etching times. The dimple is typically formed by first depositing an armature on top of a sacrificial layer. Then a hole is etched through the armature into the sacrificial layer immediately above the RF-input and/or output transmission line. The dimple is then deposited to fill the etched hole. In this case, the height of the dimple depends on the depth of the etching through the hole into the sacrificial layer. This etching process is monitored by time. The time required to obtain the proper etch depth is mainly determined from trial and error etching experiments. Because the etching is a time-controlled process, the etch depth may vary from run to run and from batch to batch depending upon the etching equipment parameters. Thus, the quality of the contact will vary from run to run. For example, if the dimple is made too shallow, the contact will be less optimal. In the worst case, if the dimple is made too deep, a joint between the dimple and the input transmission line may form, ruining the switch. Therefore, there is a need for a switch and a method of producing a switch that may be manufactured consistently to make large volume manufacturing runs economically feasible.

SUMMARY

In one aspect, the present invention teaches a head electrode region of a beam for an electromechanical device comprising a first insulating layer having electrode region edges; and a head electrode, where the head electrode comprises a locking portion, with the locking portion surrounding the electrode region edges of the first insulating layer such that the head electrode is held fixed relative to the first insulating layer.

In another aspect, the head electrode has a top region residing above the first insulating layer and a contact region residing below the first insulator, the head electrode region further comprising a second insulating layer formed to cover at least a portion of the top region of the head electrode.

BRIEF DESCRIPTION OF THE DRAWINGS

The objects, features and advantages of the present invention will be apparent from the following detailed descriptions of the preferred aspect of the invention in conjunction with reference to the following drawings, where:

FIG. 1B is a side-view of the prior art T-MEMS switch presented in FIG. 1A, in an open position;

FIG. 1C is a side-view of the prior art T-MEMS switch presented in FIG. 1A, in a closed position;

FIG. 3B is a side-view of the T-MEMS switch presented in FIG. 3A, in an open position;

FIG. 3C is a cross-section of the T-MEMS presented in FIG. 3A, in the open position, where the cross section is taken along a line through electrodes 340 and 338;

FIG. 3D is a zoomed-in view of the metal platform of the T-MEMS switch, presented in FIG. 3A;

FIG. 3E is a side-view of the T-MEMS presented in FIG. 3A, in a closed position;

FIG. 3F is a cross-section of the T-MEMS switch presented in FIG. 3A, in the closed position, where the cross section is taken along a line through electrodes 340 and 338;

FIG. 4C is a side view of the DC cross-section of the I-MEMS switch presented in FIG. 4A, in a closed position;

FIG. 4D is a side view of the RF cross-section of the I-MEMS switch presented in FIG. 4A, in a closed position;

FIG. 5A depicts a side view of a cross-section of a doubly supported cantilever beam MEMS switch in an open position in accordance with the present invention;

FIG. 5B depicts a side view of a cross-section of a doubly supported cantilever beam MEMS switch presented in FIG. 5A, in a closed position;

FIGS. 6A through 6M are side-views of a T-MEMS switch of the present invention, showing the switch at various stages of production;

FIG. 7 is a table presenting various non-limiting examples of materials, deposition processes (where applicable), removal processes (where applicable), etch processes (where applicable), and thickness ranges for the various layers that make up a MEMS switch according to the present invention;

DETAILED DESCRIPTION

Figure 1A:
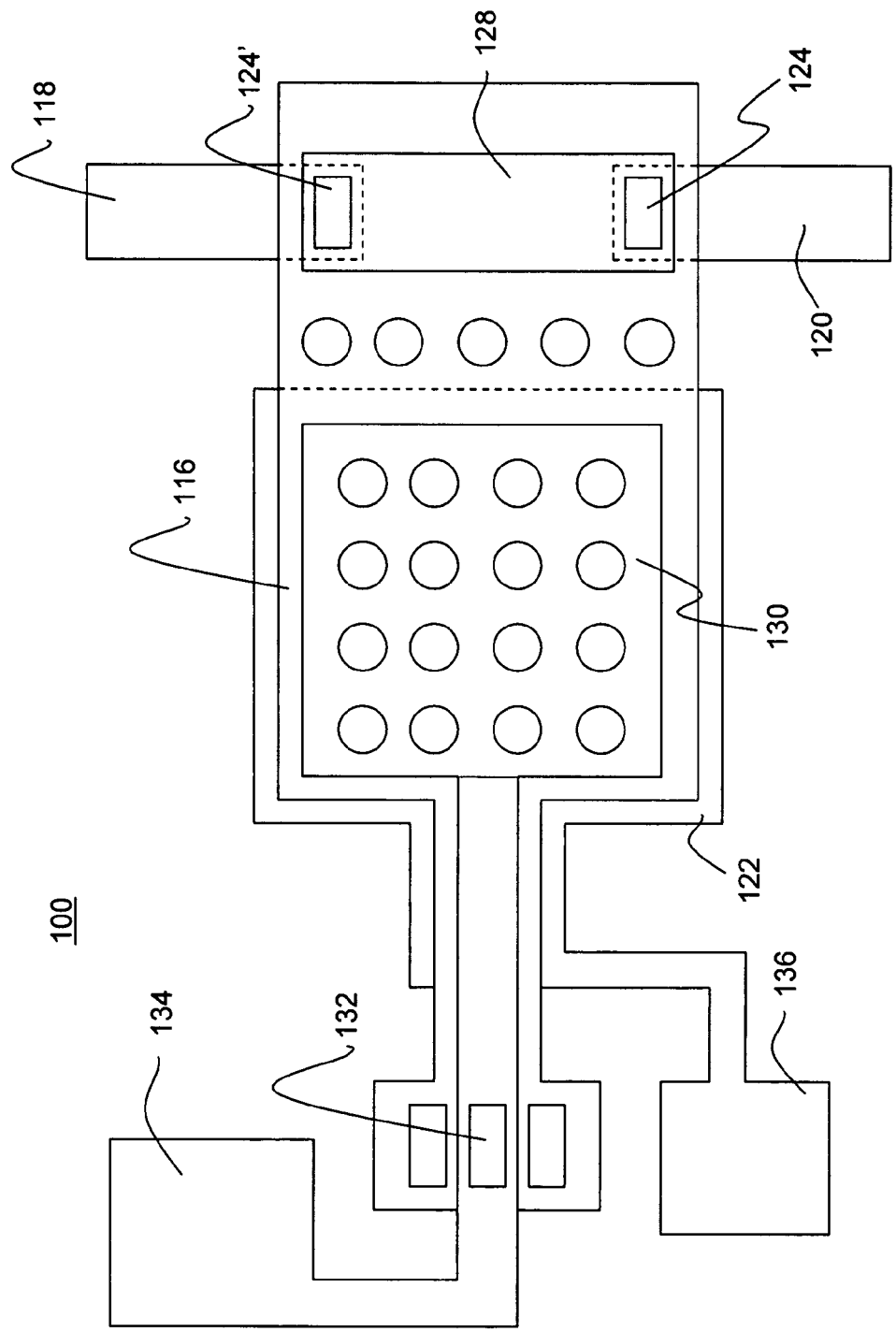
FIG. 1A is a top view of a prior art T-MEMS switch.
Figure 2A:
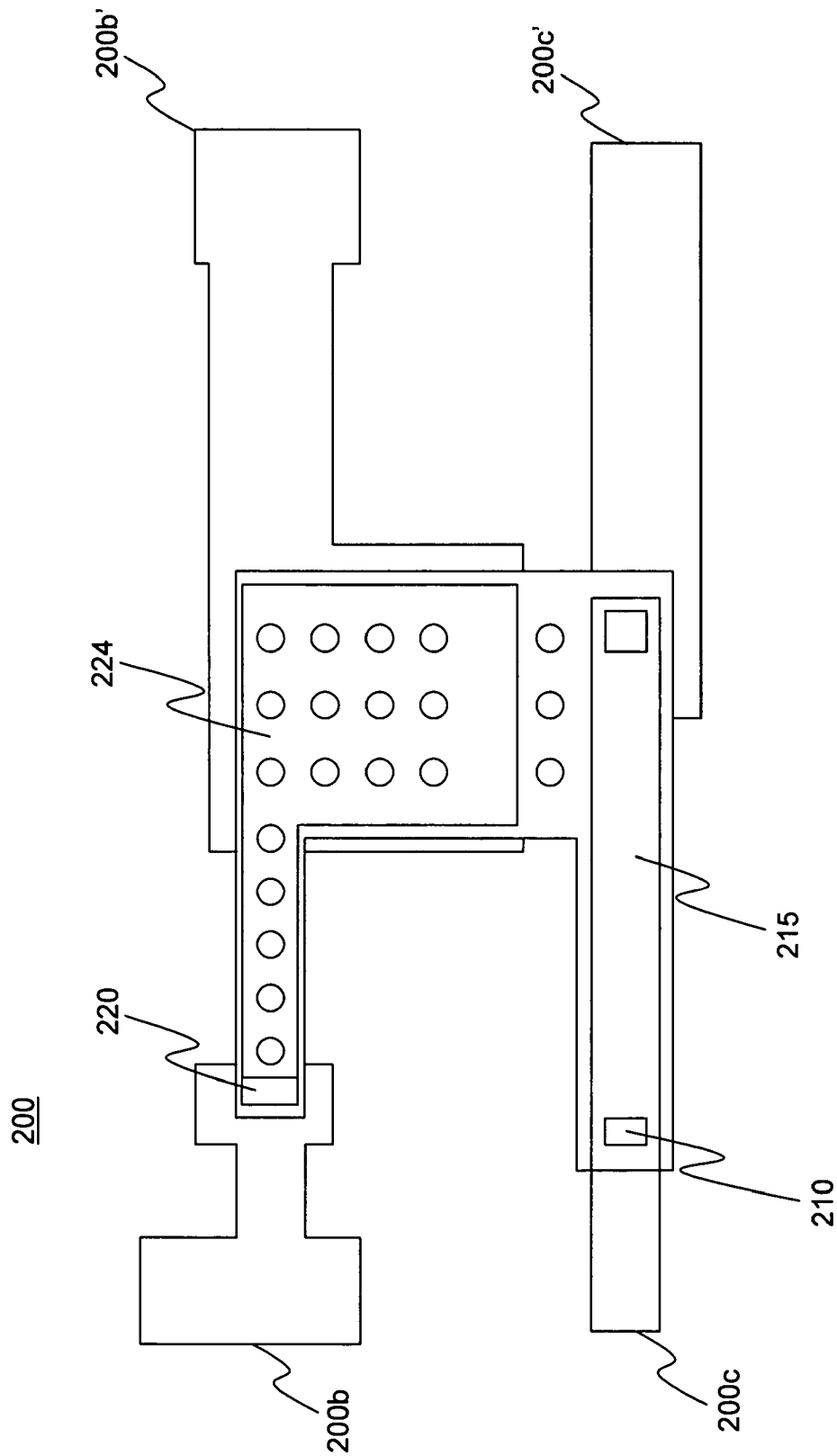
FIG. 2A is a top view of a prior art I-MEMS switch.
Figure 2B:
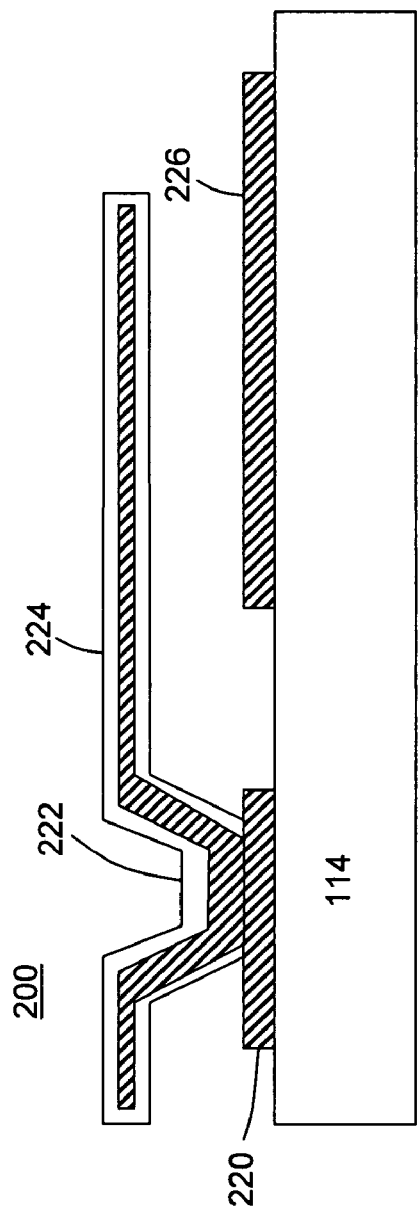
FIG. 2B is a side-view of the DC cross-section of the prior art I-MEMS switch presented in FIG. 2A, in an open position.
Figure 2C:
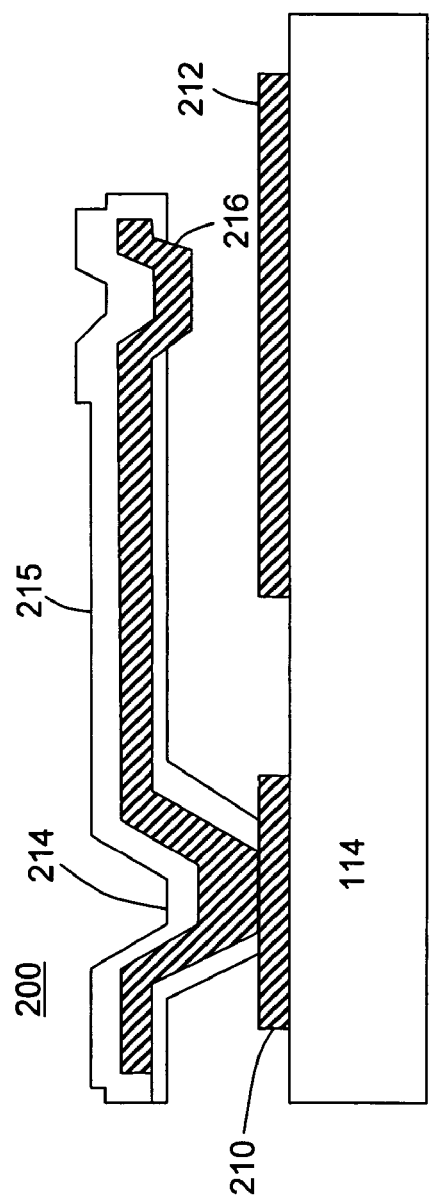
FIG. 2C is a side-view of the RF cross-section of the prior art I-MEMS switch presented in FIG. 2A, in an open position.
Figure 2D:
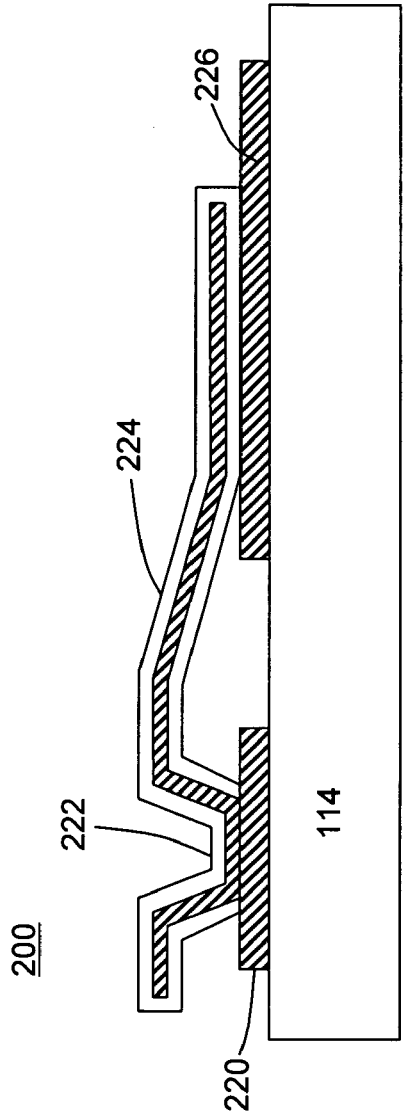
FIG. 2D is a side-view of the DC cross-section of the prior art I-MEMS switch presented in FIG. 2A, in a closed position.
Figure 2E:
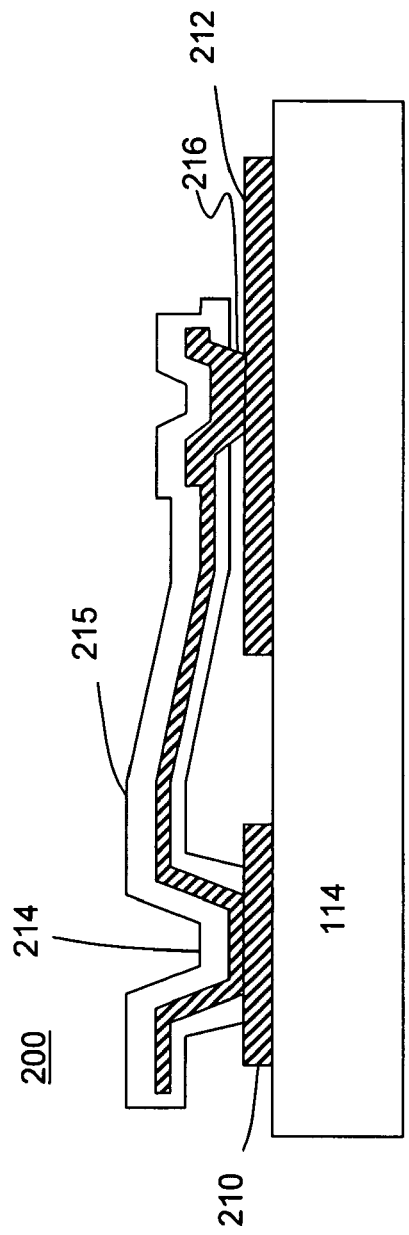
FIG. 2E is a side-view of the RF cross-section of the prior art I-MEMS switch presented in FIG. 2A, in a closed position.

The present invention relates to fabrication techniques for increasing the reliability and performance of contacts in micro-electro-mechanical system (MEMS) switches. Specifically, the invention relates to the fabrication of a planar cantilever beam, lower surface leakage, a more reliable metal contact dimple design and a high yield process. The following description, taken in conjunction with the referenced drawings, is presented to enable one of ordinary skill in the art to make and use the invention and to incorporate it in the context of particular applications. Various modifications, as well as a variety of uses in different applications, will be readily apparent to those skilled in the art, and the general principles defined herein, may be applied to a wide range of aspects. Thus, the present invention is not intended to be limited to the aspects presented, but is to be accorded the widest scope consistent with the principles and novel features disclosed herein. Furthermore, it should be noted that unless explicitly stated otherwise, the figures included herein are illustrated diagrammatically and without any specific scale, as they are provided as qualitative illustrations of the concept of the present invention.

In order to provide a working frame of reference, first a glossary of terms used in the description and claims is given as a central resource for the reader. Next, a discussion of various physical aspects of the present invention is provided. Finally, a discussion is provided to give an understanding of the specific details.

(1) Glossary

Before describing the specific details of the present invention, a centralized location is provided in which various terms used herein and in the claims are defined. The glossary provided is intended to provide the reader with a general understanding for the intended meaning of the terms, but is not intended to convey the entire scope of each term. Rather, the glossary is intended to supplement the rest of the specification in more accurately explaining the terms used.

Actuation portion: A part of a switch that moves to connect or disconnect an electrical path. Some examples include an armature and a cantilever.

Cantilever: A beam that sits above the substrate. It is affixed at the metal contact electrode at one end, and suspended freely above the RF electrodes at the opposite end.

Metal dimple portion: An area of metal that protrudes from an armature providing increased contact reliability in MEMS switches. Also referred to as a metal dimple contact.

(2) Principal Aspects

The present invention has three principal aspects. The first is a MEMS switch with a planarized cantilever beam and low surface leakage current. The MEMS switch includes an actuating portion which moves from a first position to a second position, wherein in the second position the switch provides a path for an RF signal. A metal dimple is placed on a portion of the cantilever beam that contacts metal on the RF electrodes on the substrate when the MEMS switch is closed. The present invention also teaches a fabrication method (and products by the method) that provides a stable and firm metal dimple, and a controlled dimple dry etch for manufacturing the MEMS switch with high yield and better reliability performance. Additionally, the various acts in a method according to the present invention may be automated and computer-controlled, the present invention also teaches a computer program product in the form of a computer readable media containing computer-readable instructions for operating machinery to perform the various acts required to make a MEMS switch according to the present invention. These instructions may be stored on any desired computer readable media, non-limiting examples of which include optical media such as compact discs (CDs) and digital versatile discs (DVDs), magnetic media such as floppy disks and hard drives, and circuit-based media such as flash memories and field-programmable gate arrays (FPGAs). The computer program product aspect will be discussed toward the end of this description.

Figure 3A:
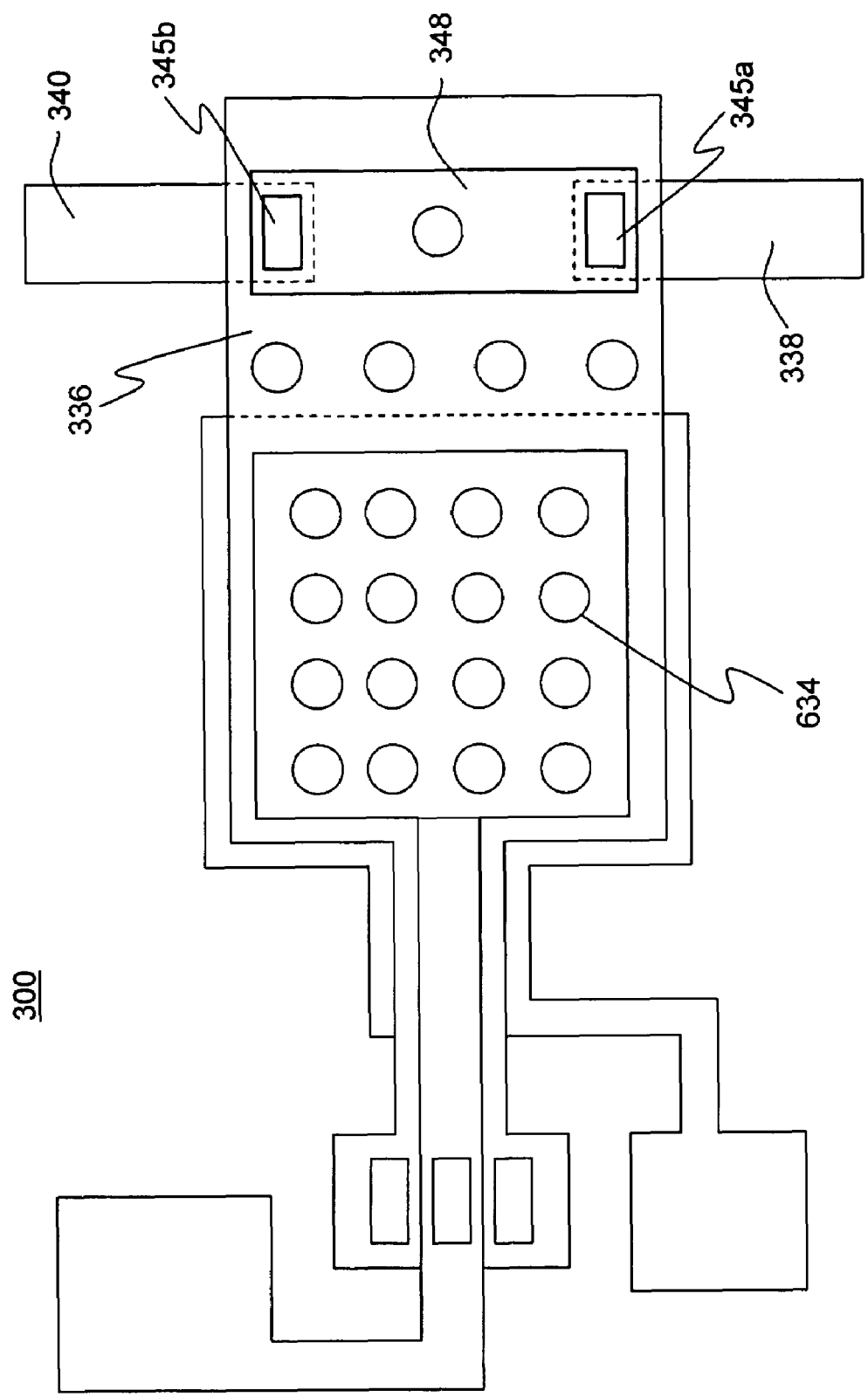
FIG. 3A is a top view of a T-MEMS switch in accordance with the present invention.

FIG. 3A is a top view of a T-MEMS switch 300. An armature 336 allows for an electrical connection between a first RF transmission line, i.e. an RF-input transmission line 340 and a second RF transmission line, i.e. an RF-output transmission line 338, when the switch is in a closed position.

FIG. 3B shows one side-view cross-section of the T-MEMS switch 300. One skilled in the art will appreciate that the cross-section only shows the contact of the armature 336 with the RF-output transmission line 338, since the contact of the RF-input transmission line 340 (shown in FIG. 3A) is directly behind the RF-output transmission line 338 when looking at the cross-section of the switch. One end of the armature 336 is affixed to an anchor electrode 332 on a substrate 114. The other end of the armature 336 is positioned over the RF-line which is divided into two separate sections, the RF-input transmission line 340 and the RF-output transmission line 338. The RF-input transmission line 340 and the RF-output transmission line 338 are separated by a gap (visible in FIG. 3A). A substrate bias electrode 342 is attached with the substrate 114 below the armature 336. The armature 336 sits above the substrate bias electrode 342 and is electrically isolated from the substrate bias electrode 342 by an air gap forming a parallel plate capacitor when the MEMS switch 300 is in an "open" position. An output top dimple electrode 345a is placed on one end of the armature 336 above the output RF transmission line 338. Similarly, an input top dimple electrode 345b (visible in FIG. 3A) is placed on the end of the armature 336 above the input RF transmission line 340, shown in FIG. 3C. The output top dimple electrode 345a and the input top dimple electrode 345b are electrically connected via a transmission line 348, shown in FIG. 3A. In one aspect, the transmission line 348 is a metal film transmission line embedded inside the armature 336. FIG. 3D shows a zoomed-in view of the input top dimple electrode 345a and the RF transmission line 338 for the base contact.

It is noteworthy that in the zoomed-in version shown in FIG. 3D, the head electrode region 380 is formed with a locking portion 382 that surrounds electrode region edges 384 of the first semiconductor region 386. The head electrode 388 has a top portion 390 and a bottom portion 392, and a second insulating layer 394 may cover at least a portion of the top portion 390 of the head electrode 388.

FIG. 3E depicts the cross-section of the T-MEMS switch 300 in FIG. 3B in a closed state. When a voltage is applied between a suspended armature bias electrode 350 and the substrate bias electrode 342, an electrostatic attractive force will pull the suspended armature bias electrode 350 as well as the attached armature 336 towards the substrate bias electrode 342. Consequently, the output top dimple electrode 345a touches the output RF transmission line 338 and the input top electrode 345b (visible in FIG. 3A) touches the input RF transmission line 340 (shown in FIG. 3F) providing a good electrical contact. Thus, the output top dimple electrode 345a, the transmission line 348 (visible in FIG. 3A), the input top dimple electrode 345b (visible in FIG. 3A) provide an electrical path for bridging the gap between the RF-input transmission line 340 and the RF-output transmission line 338, thereby closing the MEMS switch 300.

The substrate 114 may be comprised of a variety of materials. If the MEMS switch 300 is intended to be integrated with other semiconductor devices (i.e. with low-noise high electron mobility transistor (HEMT) monolithic microwave integrated circuit (MMIC) components), it is desirable to use a semi-insulating semiconducting substance such as gallium arsenide (GaAs), indium phosphide (InP) or silicon germanium (SiGe) for the substrate 114. This allows the circuit elements as well as the MEMS switch 300 to be fabricated on the same substrate using standard integrated circuit fabrication technology such as metal and dielectric deposition, and etching by using the photolithographic masking process. Other possible substrate materials include silicon, various ceramics, and quartz. The flexibility in the fabrication of the MEMS switch 300 allows the switch 300 to be used in a variety of circuits. This reduces the cost and complexity of circuits designed using the present MEMS switch.

In the T-MEMS switch (see FIGS. 3A-3F), when actuated by electrostatic attraction, the armature 336 bends towards the substrate 114. This results in the output top dimple electrode 345a and the input top dimple electrode 345b on the armature 336 contacting the output RF transmission line 338 and input RF transmission line 340 respectively, and the armature 336 bending to allow the suspended armature bias electrode 350 to physically contact the substrate bias electrode 342. This fully closed state is shown in FIG. 3E. The force of the metallic contact between the output RF transmission line 338 and the output top dimple electrode 345a (also the input RF transmission line 340 and the input top dimple electrode 345b) is thus dependent on the spring constant force at the RF-output transmission line 340 and RF-input transmission line 338 when the switch is closed. Metallic switches that do not have protruded dimple contact designs have contacts that depend upon the whole armature flexibility and bias strength. It is considered that this type of metal contact T-switch is less reliable than the micro-relay switches with protruded dimple contacts such as those taught here. In addition to improving the switch reliability, the quality of the contact itself is improved by the dimple because the dimple has controllable geometric features such as size (area and height) and shape. Thus, MEMS switches without the dimples 345a and 345b are more likely to have time-varying contact characteristics, a feature that may make them difficult or impossible to use in some circuit implementations.

One skilled in the art will appreciate that the RF-input transmission line 340 may be permanently attached with one end of the transmission line 348 in the armature 336. In this case, the switch 300 is open when a gap exists between the RF-output transmission line 338 and the transmission line 348. Further, one skilled in the art will appreciate that the RF-output transmission line 338 may be permanently attached with one end of the transmission line 348 in the armature 336. In this case the switch is open when a gap exists between the RF-input transmission line 340 and the transmission line 348.

Figure 4A:
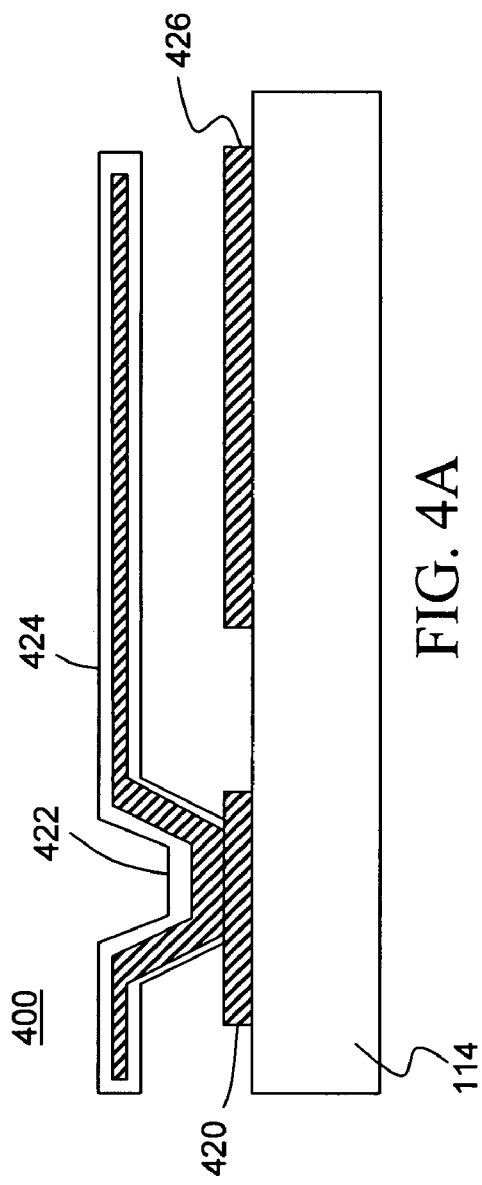
FIG. 4A is a side view of a DC cross-section of an I-MEMS switch in an open position in accordance with the present invention.

FIG. 4A depicts a DC cross-section of an I-MEMS switch 400 in accordance with the present invention. Depicted in FIG. 4A, a DC signal is passed from the DC contact 420 through an anchor point 422 and into the DC cantilever structure 424. In the cross-sectional view of FIG. 4A, a portion of a metal dimple 416 (shown in FIG. 4B) would be seen in the background if the RF portion of the switch 400 were shown. A substrate bias electrode 426 is positioned on the substrate 114. As a DC bias is applied to the DC contact 420 and the substrate bias electrode 426, the DC cantilever structure 424 is pulled toward the substrate 114. FIGS. 4C and 4D depict the switch of FIGS. 4A and 4B, respectively, in a closed position.

Figure 4B:
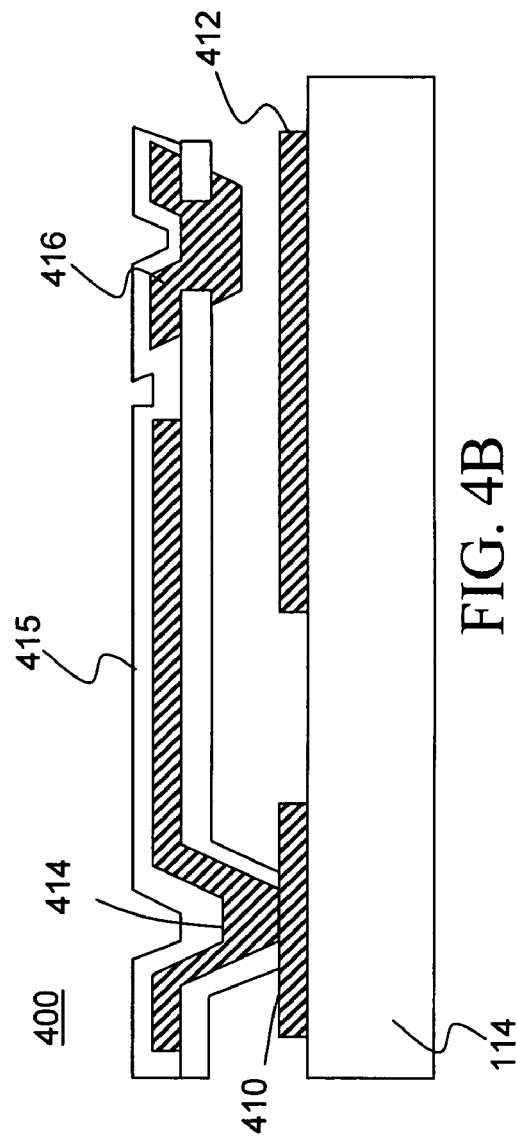
FIG. 4B is a side view of a RF cross-section of the I-MEMS switch presented in FIG. 4A, in an open position.

FIG. 4B depicts the RF cross-section of switch 400. The RF-input transmission line 410 passes through anchor point 414 and into the RF cantilever structure 415. Upon contact, the metal dimple 416 allows electricity to passes through the RF cantilever structure 415. The metal dimple 416 also provides an electrical contact between the RF-input transmission line 410 and the RF-output transmission line 412 when the switch is in a closed position. As discussed above, when a DC bias is applied to the DC contact 420 and the substrate bias electrode 426, the DC cantilever structure 424 is pulled toward the substrate 114. The deflection of the DC cantilever structure 424 toward the substrate 114 also causes the RF cantilever structure 415 to bend toward the substrate 114, providing an electrical path between the RF-input transmission line 410 and the RF-output transmission line 412.

In the I-MEMS switch (see FIGS. 4A-4D), the gap between the RF-output transmission line 412 and the metal dimple 416 is smaller than the gap between the substrate bias electrode 426 and the suspended armature bias electrode in the armature 424. When actuated by electrostatic attraction, the armature structure, comprising the DC cantilever structure 424 and the RF cantilever structure 415, bends towards the substrate 114. First, the metal dimple 416 on the RF cantilever structure 415 contacts the RF transmission line 416, at which point the armature bends to allow the DC cantilever structure 424 to physically contact the substrate bias electrode 426. This fully closed state is shown in FIGS. 4C and 4D. The force of the metallic contact between the RF transmission line 412 and the metal dimple 416 is thus dependent on the spring constant force at the RF transmission line 412 when the switch is closed. Existing metallic switches that do not have contact dimples have contacts that depend upon the whole armature flexibility and bias strength. It is considered that this type of metal contact T-switch is less reliable than the micro-relay switches with dimple contacts such as those taught by the present invention. In addition to improving the switch reliability, the quality of the contact itself is improved by the dimple because the dimple has controllable geometric features such as size (area and height) and shape. Thus, MEMS switches without the dimple contact are more likely to have time-varying contact characteristics, a feature that may make them difficult or impossible to use in some circuit implementations.

FIG. 5A depicts a cross-section of a doubly supported cantilever beam MEMS switch 500. An RF-input transmission line 510 is included in a cantilever beam 512. An RF-output transmission line 514 is located on a substrate 114. The cantilever beam 512, unlike the switches previously discussed, is attached with the substrate 114 at two ends. The cantilever beam 512 also includes a cantilever bias electrode 516. A substrate bias electrode 518 is located on the substrate 114. When a DC bias is applied to the cantilever bias electrode 516 and the substrate bias electrode 518, the cantilever beam 512 moves from the open position, shown in FIG. 5A to a closed position, shown in FIG. 5B. In the closed position, an electrical path is created between the RF-input transmission line 510 and the RF-output transmission line 514. Note that rather than passing along the beam, the RF signal could also be passed from an RF-input transmission line to an RF-output transmission line by using a line with a pair of dimples.

As discussed above, the prior art T-MEMS switches have dimples attached with the armature. Because the formation of the dimple in the armature requires a highly sensitive, time-controlled etching process, the yield and performance of the MEMS switches will vary from lot to lot. However, with the design disclosed herein, by placing metal platforms on the input and output RF electrodes that are protruded from the substrate (instead of having a deep dimple on the armature), the yield and performance of MEMS switch fabrication is increased. A few of the potential applications of these MEMS switches are in the RF, microwave, and millimeter wave circuits, and wireless communications spaces. For example, these MEMS switches can be used in commercial satellites, antenna phase shifters for beam-steering, and multi-band and diversity antennas for wireless cell phones and wireless local area networks (WLANS).

The following is an exemplary set of operations that may be used in the manufacturing of the device disclosed herein. One skilled in the art will appreciate that the acts outlined are to indicate changes from the prior art manufacturing process, and are not intended to be a complete list of all acts used in the process. One skilled in the art will appreciate that the MEMS switches may have varying designs, such as I configurations and T configurations. However, the manufacturing acts disclosed herein are for the formation of a fabrication method for making a reliable microrelay MEMS switch on a substrate, which may be utilized in any MEMS switch configuration. The manufacturing process is described using the terminology for the I configuration as an illustration, however, those of skill in the art will realize that the acts presented are readily adaptable for other switch types.

FIG. 6 depicts a substrate. As shown in FIG. 6A, a first $Si_3N_4$ (dielectric) layer 600 having a thickness and an area is deposited by Plasma Enhanced Chemical Vapor Deposition (PECVD) or by Low Pressure Chemical Vapor Deposition (LPCVD) on top of a substrate having a substrate area. It is then, as shown in FIG. 6B, followed by the depositing of a first (optional) insulating ($SiO_2$) layer 602 on top of the first $Si_3N_4$ layer 600. In one aspect, the $Si_3N_4$ thickness is between 1000 angstrom to 5000 angstrom, and the $SiO_2$ thickness is approximately in the range from 1.0 micron to 3.0 microns. The wafer is then patterned with a first photoresist layer to cover the $SiO_2$ layer and open windows in areas where the DC, RF, and actuation metal electrodes will be situated. This is done by first removing the oxide in the DC, RF, and actuation metal electrode areas by wet or dry etching to form electrode spaces, and is followed by Au depositing to refill and to replace the etched oxide totally, thus depositing a first conductor layer in the electrode spaces in the first dielectric layer 600. The unwanted Au may then be removed by a lift-off process. In one aspect, the planarized first metal layer 604 is approximately between one micron and three microns thick gold (Au) and the substrate 114 is a material such as Gallium Arsenide (GaAs), high resistivity silicon (Si) or glass/Quartz. In short, this planarized first metal layer 604 is used to form an input contact electrode, an anchor electrode, an RF-input and output lines and a substrate bias electrode on the substrate. This processing act completes the planarization of the cantilever beam, and it is also acting as a surface passivation layer to the substrate. The results of these operations are shown in FIG. 6C.

Figure 6D:
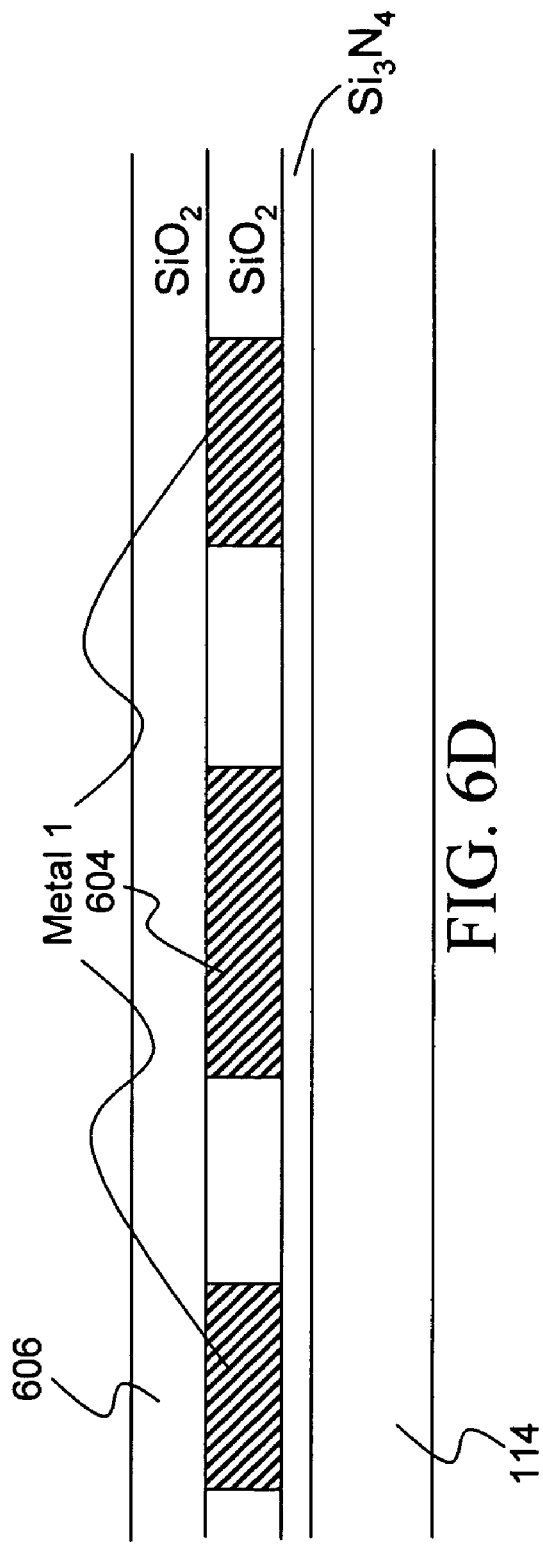

Next, as shown in FIG. 6D, a thick $SiO_2$ sacrificial layer 606 having a thickness is deposited over the planarized first conductor (metal) layer 604. This sacrificial oxide layer 606 is used to provide a base for the armature, and will later be removed. In one aspect, the sacrificial oxide layer 606 is a silicon dioxide layer approximately between 2 microns to 3 microns thick.

Figure 6E:
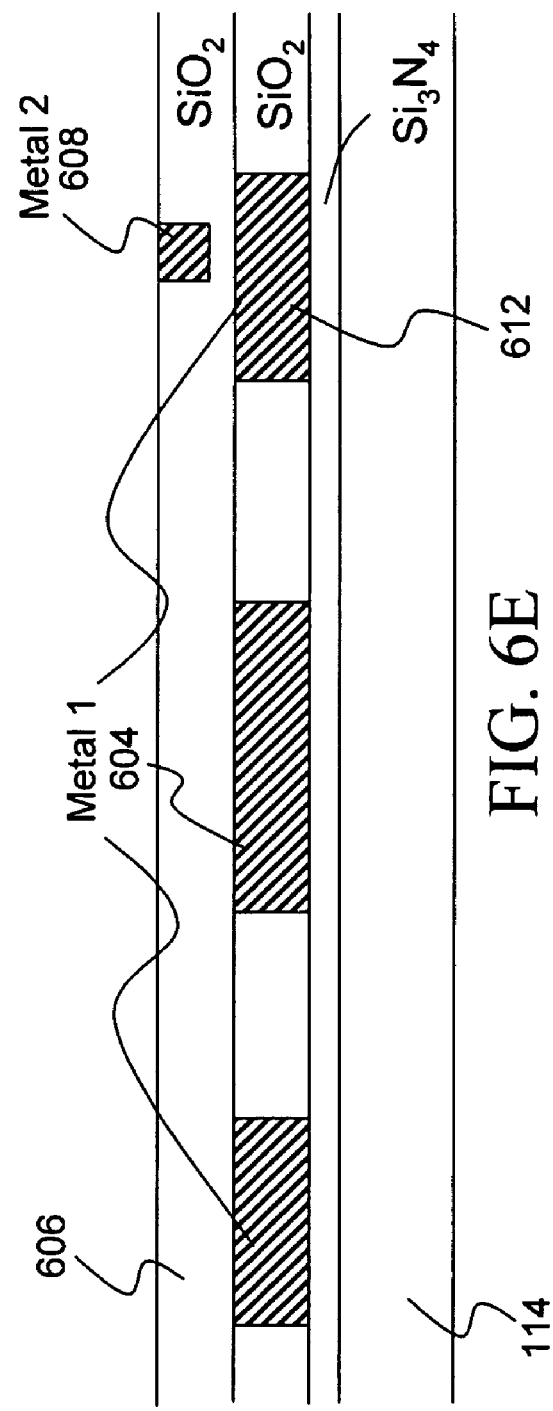

Next, as shown in FIG. 6E, a small area 608 (depicted as a square area) above the RF electrode 610 is etched into the sacrificial oxide layer 606 defining the metal dimple contact area (a top electrode space). Again, a lift-off process is performed to deposit Au inside to form the bottom dimple contact electrodes 612. In one aspect, the small square area is approximately between 100 to 600 square microns in area, and the depth of the etched dimple contact is approximately between 0.2 to 0.5 microns. Note that this act, may be performed either before or after the act resulting in FIG. 6F below. It is important to note that departures from the specific order of the steps presented may be made without affecting the general nature of the invention, as will be appreciated by those skilled in the art.

Figure 6F:
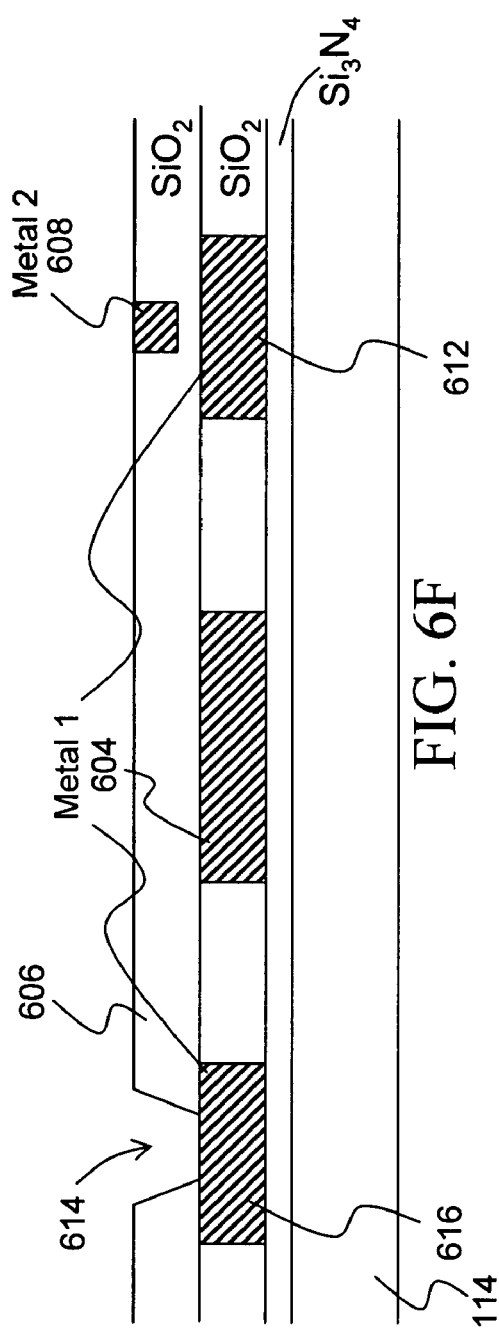
Figure 6G:
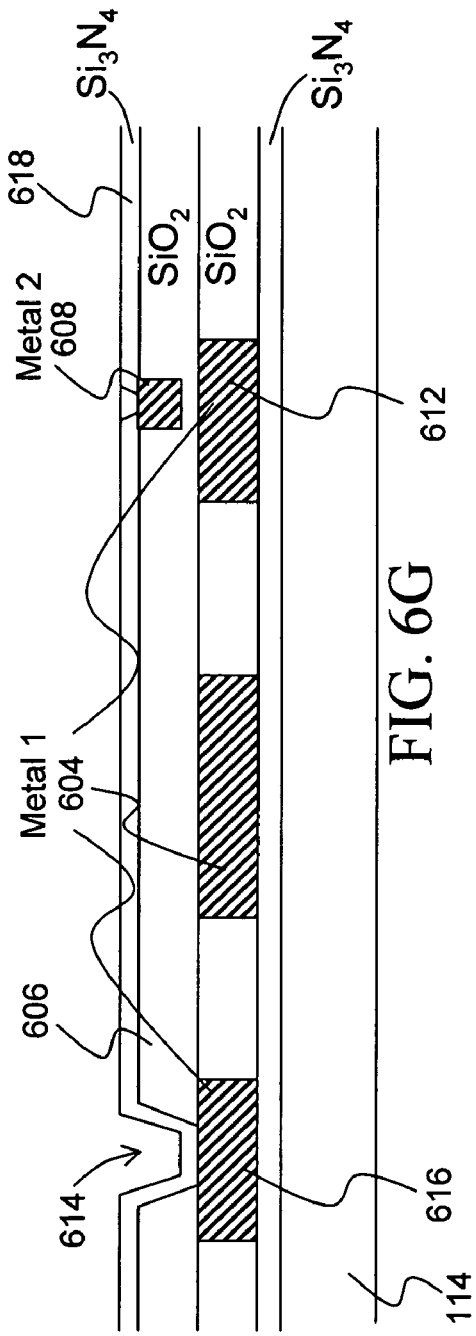

Following, as shown in FIG. 6F, a via 614 is etched in the sacrificial oxide layer 606 over the anchor electrode 616, which is a portion of the planarized first metal layer 604, thus forming an anchor site. This is then followed, as shown in FIG. 6G, by a deposition of a low stress PECVD Nitride layer 618 over the sacrificial oxide layer 606. The Nitride Layer 618 acts as a first structural layer having an area. In one aspect, the low stress Nitride layer 618 is approximately between one micron and two microns thick. The Nitride Layer 618 is then etched across at least a portion of the via 614 (anchor site) so that a portion of the first conductor layer 604 is exposed.

Figure 6H:
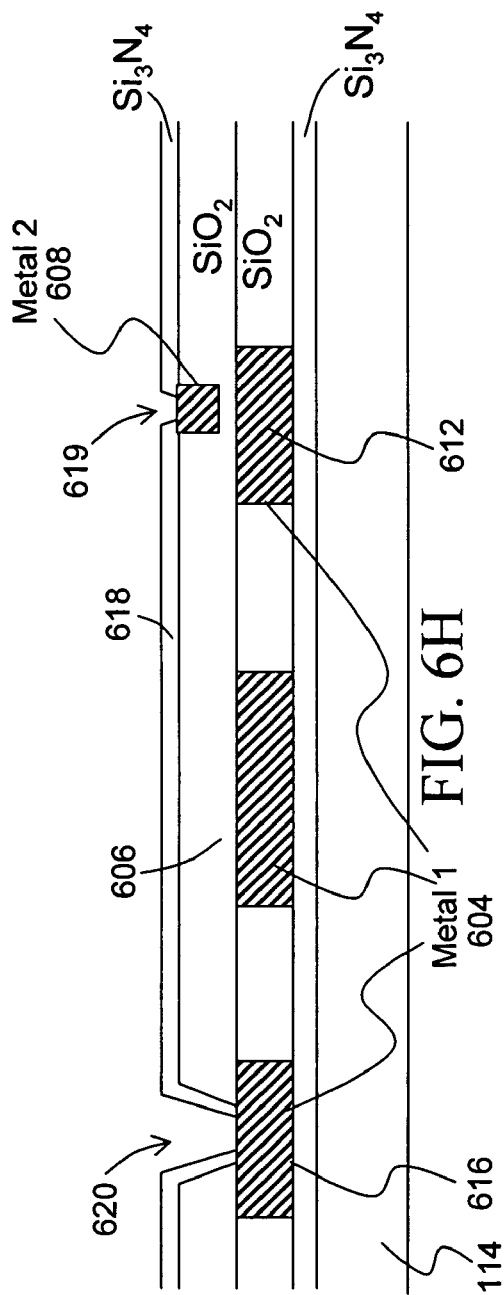

The next operation is illustrated in FIG. 6H, where via holes 620 are created by removing the nitride layer 618 over the anchor electrode 616 and in the small area over the dimple contact 612. The removal of the nitride layer 618 over the dimple contact 612 provides for a small input dimple or an input top electrode 619 attached with the armature. This operation of removal may be accomplished using dry etching, and this etching cannot be over etched because it will stop at the previously deposited dimple metal layer. This is a useful manufacturing act because the switch contact depth is well controlled by the metal layer (the metal acts as a barrier to the etching process).

Figure 6I:
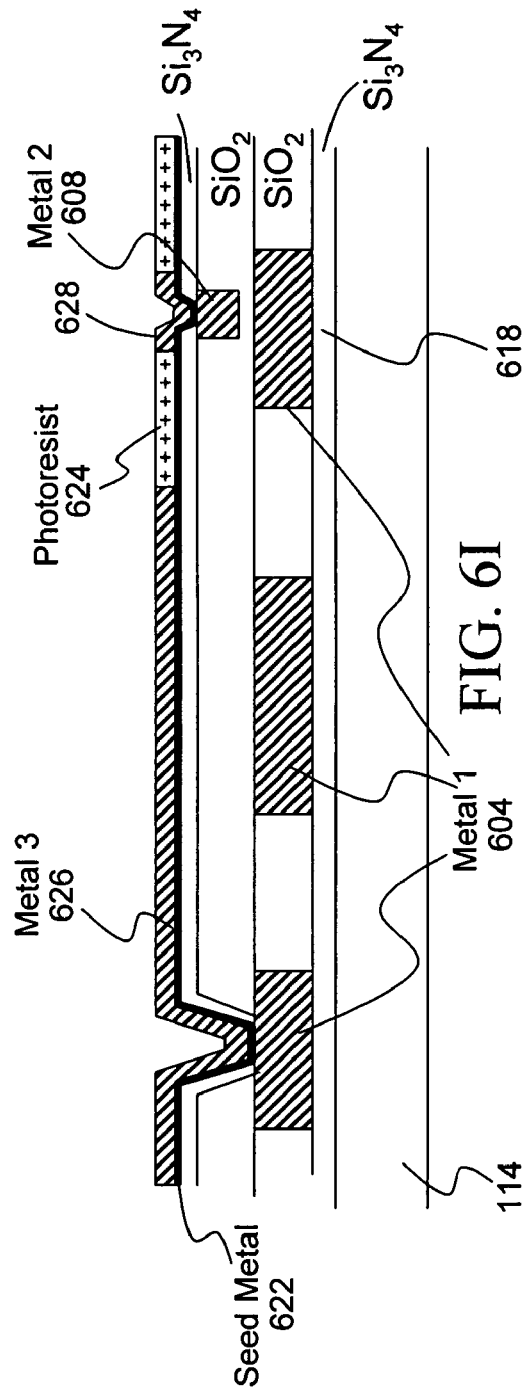

Next, as shown in FIG. 6I, a seed metal layer 622 is deposited over the substrate 114 for plating. The thin metal layer 622 may be gold (Au). In one aspect, the thin metal layer 622 is approximately between one hundred and five hundred angstroms thick. After the deposition of the seed metal layer 622, a photoresist layer 624 is placed over areas of the seed metal layer 622 on which the deposition of metal is not desired. This allows for the formation of separation regions for electrically separating (isolating) desired areas of the overall device (e.g., the armature bias pad from the input top electrode) as well as separating different devices on a substrate wafer. A plated metal layer 626 is then created above the thin metal film (seed metal layer 622) using techniques well known in the art. This plated metal layer 626 allows for the formation of the input top electrode 628, the transmission line, and the armature bias electrode. In one aspect, the plated metal layer 626 is approximately between one to three microns thick.

Then, as shown in FIG. 6J, a gold etch photoresist layer 630 is deposited over the areas of the plated layer 626 to be protected. Next, the un-protected thin metal seed layer 622 is etched so that the un-protected thin metal seed layer 622 is removed from the areas where the photoresist layer 630 was not placed. The photoresist layer 630 is then removed. The etching may be, for example, wet etching. The result is shown in FIG. 6K.

Next, as shown in FIG. 6L, a low stress structure Nitride layer 632 may be deposited using PECVD to cover the substrate 114. In one aspect, the low stress Nitride layer 632 is one to two microns thick.

As depicted in FIG. 6M, portions of this Nitride layer 632 are etched to remove the unwanted nitride and drill release holes 634, as shown in FIG. 3A, though the armature. Release holes are shown more clearly in FIG. 3A. The drill release holes 643 are useful for several reasons: first, they assist in the beam releasing process, second, the holes play a role during actuation by providing an exit for air caught between the beam and the substrate, and third, the drill holes reduce the mass of the beam, which helps to increase the switching speed.

The final act is etching off the sacrificial layer using an etching solution, such as Hydrogen Fluoride (HF). The cantilever beam is then released in a supercritical point dryer. The result is the MEMS switch similar to that shown in FIGS. 3A through 3E. One skilled in the art will appreciate that the same acts can be used in the manufacture of the MEMS T-switch as shown in FIG. 4 as well as in the manufacture of the bridge-type MEMS switch shown in FIG. 5.

In one aspect, the chip size containing the MEMS switch, such as those taught herein is 800×400 microns. The metal electrode pad is on the order of 100×100 microns. The actuation pad may vary from 100-20×100-20 microns depending upon the design of the specific actuation voltage. The RF line may vary between 60-15 microns wide. The above dimensions are provided as exemplary and are not intended to be construed as limiting. Instead, one skilled in the art will appreciate that different dimensions may be used depending upon the size of the MEMS switch being designed and the application for which it is being used. Furthermore, a table is presented in FIG. 7, providing non-limiting examples of materials, deposition processes (where applicable), removal processes (where applicable), etch processes (where applicable), and thickness ranges for the various layers that make up a MEMS switch according to the present invention. It is important that this table be considered simply as a general guide and that it be realized that the present invention may use other materials, deposit processes, removal processes, etch processes, and thicknesses than those described and that the information provided in FIG. 7 is intended simply to assist the reader in gaining a better general understanding of the present invention.

Figure 8:
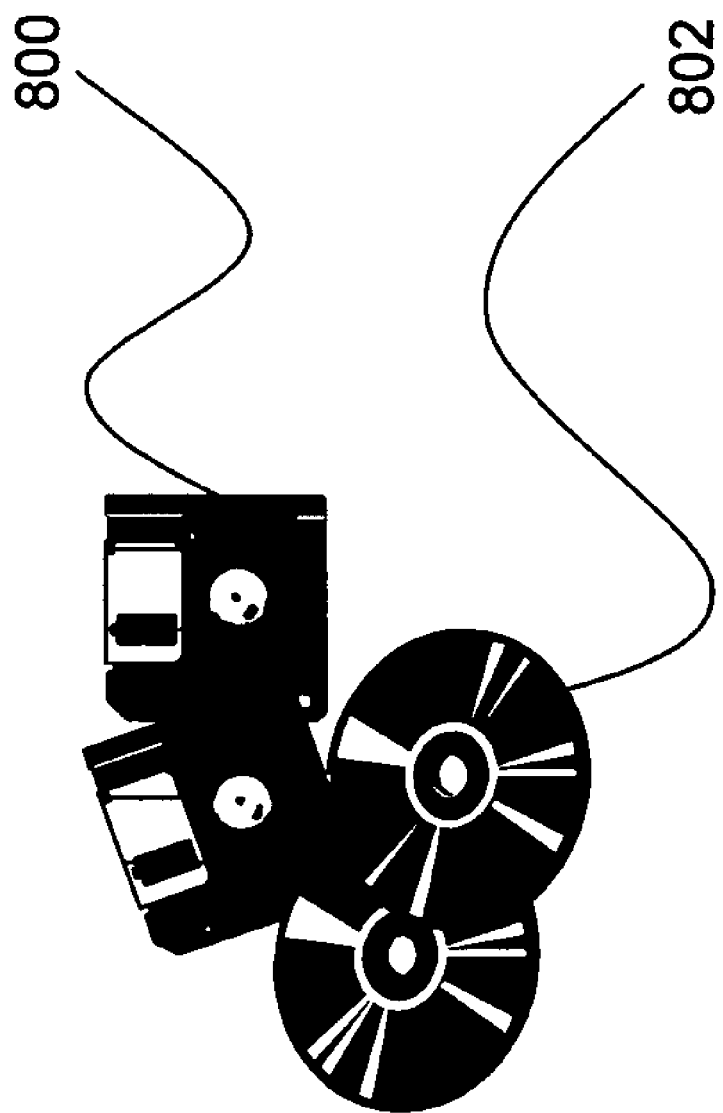
FIG. 8 is an illustrative diagram of a computer program product aspect of the present invention.

As stated previously, the operations performed by the present invention may be encoded as a computer program product. The computer program product generally represents computer readable code stored on a computer readable medium such as an optical storage device, e.g., a compact disc (CD) or digital versatile disc (DVD), or a magnetic storage device such as a floppy disk or magnetic tape. Other, non-limiting examples of computer readable media include hard disks, read only memory (ROM), and flash-type memories. An illustrative diagram of a computer program product embodying the present invention is depicted in FIG. 8. The computer program product is depicted as a magnetic disk 800 or an optical disk 802 such as a CD or DVD. However, as mentioned previously, the computer program product generally represents computer readable code stored on any desirable computer readable medium.

Figure 9:
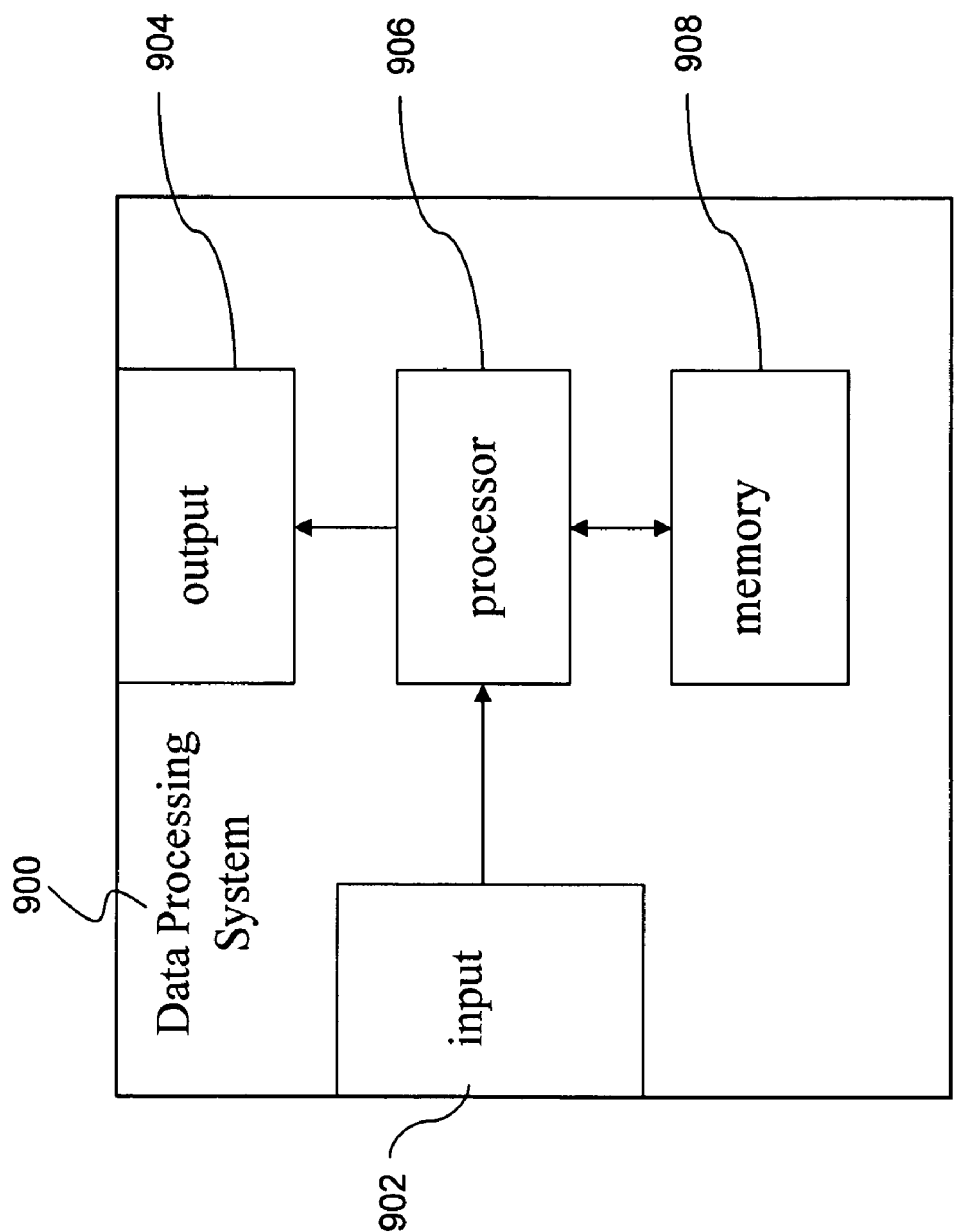
FIG. 9 is a block diagram of a data processing system used in conjunction with the present invention.

When loaded onto a semiconductor process control computer as shown in FIG. 9, the computer instructions from the computer program product provides the information necessary to cause the computer to perform the operations/acts described with respect to the method above, resulting in a device according to the present invention.

A block diagram depicting the components of a computer system that may be used in conjunction with the present invention is provided in FIG. 9. The data processing system 900 comprises an input 902 for receiving information from at least a computer program product or from a user. Note that the input 902 may include multiple "ports." The output 904 is connected with a processor 906 for providing information regarding operations to be performed to various semiconductor processing machines/devices. Output may also be provided to other devices or other programs, e.g. to other software modules for use therein or to display devices for display thereon. The input 902 and the output 904 are both coupled with the processor 906, which may be a general-purpose computer processor or a specialized processor designed specifically for use with the present invention. The processor 906 is coupled with a memory 908 to permit storage of data and software to be manipulated by commands to the processor.

What is claimed is:

1. A head electrode region of a beam for an electromechanical device comprising:
   a first insulating layer having electrode region edges; and
   a head electrode, where the head electrode comprises a top region, and a bottom portion, with the head electrode surrounding the electrode region edges of the first insulating layer such that the head electrode is held fixed relative to the first insulating layer, wherein the head electrode has a top region with a portion of the top region residing above the first insulating layer and a contact region with a portion of the contact region residing below the first insulator, such that a portion of the electrode region edges are sandwiched between the top region and the contact region.

2. A head electrode region of a beam for an electromechanical device as set forth in claim 1, the head electrode region further comprising a second insulating layer that is formed to cover at least a portion of the top region of the head electrode.

* * * * *